(12) United States Patent
McLaury et al.

(10) Patent No.: US 6,917,536 B1
(45) Date of Patent: Jul. 12, 2005

(54) MEMORY ACCESS CIRCUIT AND METHOD FOR READING AND WRITING DATA WITH THE SAME CLOCK SIGNAL

(75) Inventors: Loren L. McLaury, Hillsboro, OR (US); David J. Wicker, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 196 days.

(21) Appl. No.: 10/243,014

(22) Filed: Sep. 13, 2002

(51) Int. Cl.[7] .............................................. G11C 11/00
(52) U.S. Cl. .................. 365/154; 365/230.06; 365/233; 326/37
(58) Field of Search .......................... 365/154, 230.06, 365/233; 326/37

(56) References Cited

U.S. PATENT DOCUMENTS

| | | | |
|---|---|---|---|
| 5,802,579 A | | 9/1998 | Crary ........................ 711/149 |
| 5,818,751 A | * | 10/1998 | Ho et al. .................... 365/154 |
| 5,944,813 A | * | 8/1999 | Trimberger ................. 712/36 |
| 5,973,955 A | * | 10/1999 | Nogle et al. ................ 365/154 |
| 6,144,604 A | | 11/2000 | Haller et al. ............... 365/221 |
| 6,259,634 B1 | | 7/2001 | Kengeri et al. ........ 365/189.04 |
| 6,430,088 B1 | * | 8/2002 | Plants et al. .......... 365/189.04 |
| 6,542,401 B2 | * | 4/2003 | Yamauchi et al. .......... 365/154 |
| 2004/0000928 A1 | * | 1/2004 | Cheng et al. ................ 326/41 |

OTHER PUBLICATIONS

Xilinx, Virtex–II 1.5V, Advance Product Specification sheets, dated Oct. 2, 2001.

* cited by examiner

*Primary Examiner*—Hoai Ho

(57) ABSTRACT

A read operation and a write operation are synchronized via one port of a memory cell to avoid contention between such operations while doubling the bandwidth of such operations. Data is read from and data is written to a memory cell through a single port of the cell. A memory cell having a port is provided, and a clock signal is also provided for clocking the memory cell. The clock signal has a leading edge and a lagging edge within a clock signal cycle. During a single clock cycle, an enable read control signal is asserted in response to the clock signal, and an enable write control signal is asserted in response to the clock signal. In response to the enable read control signal, read data stored within the memory cell is read through a port of the cell. In response to the enable write control signal, write data is written to the memory cell through the port.

23 Claims, 16 Drawing Sheets

MEMORY ACCESS CIRCUIT AND METHOD FOR READING AND WRITING DATA WITH THE SAME CLOCK SIGNAL

TECHNICAL FIELD

This invention relates generally to memory access technology and, more particularly, to a mechanism for reading from and writing to a memory cell via a same memory port within one clock cycle.

BACKGROUND

FIG. 1 shows an example memory cell 100 which is a SRAM (static random access memory) cell. The present invention is described for SRAM cells, but the present invention may be practiced with other types of memory cells as would be apparent to one of ordinary skill in the art from the description herein. A SRAM is comprised of an array of such a SRAM cell 100. For some applications, data of the SRAM is simultaneously shared by a plurality of memory accessing devices. For such applications, the SRAM cell of the SRAM array is a multiport SRAM cell for providing access to the data of the SRAM cell for a plurality of memory accessing devices.

The SRAM cell 100 of FIG. 1 includes a bistable loop of a first inverter 102 and a second inverter 104. The first inverter 102 is comprised of a first PMOSFET (P-channel metal oxide semiconductor field effect transistor) 106 and a first NMOSFET (N-channel metal oxide semiconductor field effect transistor) 108 coupled between a positive power supply $V_{CC}$ 118 and the ground node 120. The second inverter 104 is comprised of a second PMOSFET 110 and a second NMOSFET 112 coupled between the positive power supply $V_{CC}$ 118 and the ground node 120. The input of the first inverter 102 is coupled to the output of the second inverter 104 at a first bistable node 114, and the input of the second inverter 104 is coupled to the output of the first inverter 102 at a second bistable node 116. The first and second bistable nodes 114 and 116 store the data of the SRAM cell 100, as known to one of ordinary skill in the art of electronics.

In addition, the example SRAM cell 100 includes a first pass gate 122 comprising a first port of the SRAM cell 100 and a second pass gate 124 comprising a second port of the SRAM cell 100. The first and second pass gates 122 and 124 are comprised of a pair of a PMOSFET and an NMOSFET, and such implementation of pass gates is known to one of ordinary skill in the art of electronics.

First access control signals R/WA1 and R/WA1* (the complement of R/WA1) are provided by a first memory accessing device to the first pass gate 122 for accessing the SRAM cell 100 for either reading data from or writing data to the SRAM cell 100. Second access control signals R/WA2 and R/WA2* (the complement of R/WA2) are provided by a second memory accessing device to the second pass gate 124 for either reading data from or writing data to the SRAM cell 100.

Referring to FIG. 2, in the prior art, the first memory accessing device accesses the SRAM cell 100 for a first read or write operation 136 via the first pass gate 122 comprising the first port of the SRAM cell 100 during a first cycle 132 of a clock signal 130. Then, the second memory accessing device accesses the SRAM cell 100 for a second read or write operation 138 via the second pass gate 124 comprising the second port of the SRAM cell 100 during a second cycle 134 of the clock signal 130. Such operations are performed during separate clock cycles 132 and 134 for prevention of contention between such operations 136 and 138. For example, referring to FIG. 3, if both the first and second read or write operations 136 138 by the first and second memory accessing devices were performed during the same first cycle 132 of the clock signal 130, then such write and read operations 136 and 138 may overlap resulting in contention between the first and second memory accessing devices.

Thus, to prevent such contention in the prior art, each read or write operation is performed within a respective separate cycle of the clock signal. However, performance of each read or write operation within a respective separate cycle of the clock signal limits the bandwidth of such operations to the frequency of the clock signal.

Thus, a mechanism is desired for synchronizing a read operation and a write operation within one cycle of a clock signal for increasing the bandwidth of such operations while at the same time preventing contention between such operations.

SUMMARY

Accordingly, in a general aspect of the present invention, a read operation and a write operation are synchronized via one port of a memory cell to avoid contention between such operations while doubling the bandwidth of such operations.

In one example embodiment, data is read from and data is written to a memory cell through a single port of the cell. A memory cell having a port is provided, and a clock signal is also provided for clocking the memory cell. The clock signal has a leading edge and a lagging edge within a clock signal cycle. During a single clock cycle, an enable read control signal is asserted in response to the clock signal, and an enable write control signal is asserted in response to the clock signal. In response to the enable read control signal, read data stored within the memory cell is read through a port of the cell. In response to the enable write control signal, write data is written to the memory cell through the port.

In one embodiment, the enable write control signal is asserted after the enable read control signal is asserted such that read data is read from the memory cell before write data is written into the memory cell. In an alternative embodiment of the present invention, the enable write control signal is asserted before the enable read control signal is asserted such that the read data is same as the write data.

In a further embodiment of the present invention, the enable read control signal is asserted after the lagging edge of the clock signal cycle such that the read data is read out via the port of the memory cell after the lagging edge of the clock signal cycle. In that case, the enable write control signal may be asserted either before the lagging edge of the clock signal cycle or after the lagging edge of the clock signal cycle and after the enable read control signal is asserted.

In any case, in this manner, the enable read control signal and the enable write controls signal are generated within one clock cycle to increase the bandwidth of the read and write operations. Furthermore, performance of such operations are synchronized through the same one port of the memory cell to avoid contention between such operations.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, and 19 refer to elements having similar structure and function.

DETAILED DESCRIPTION

Figure 1:
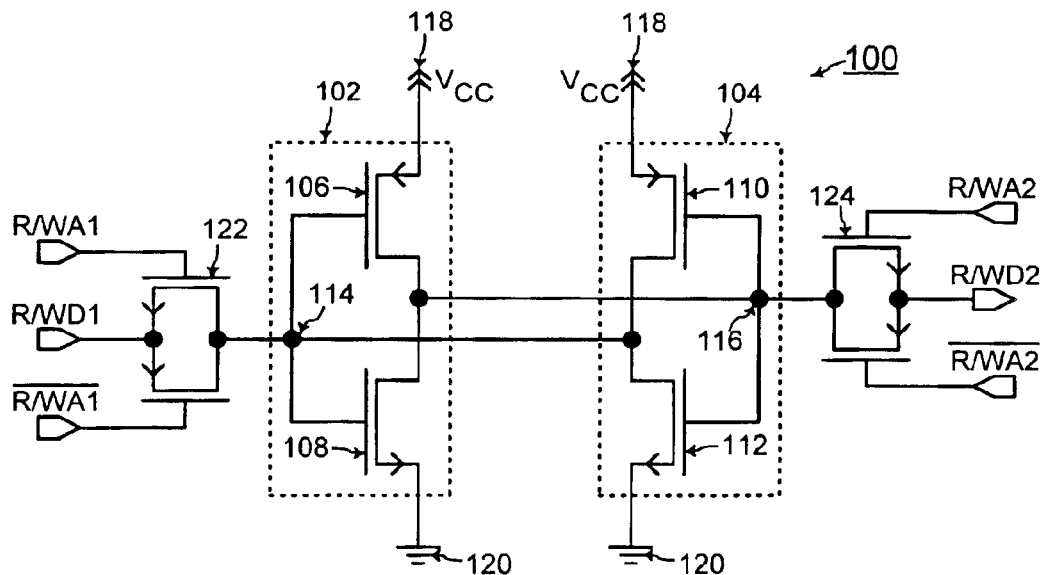
FIG. 1 shows an example implementation of a multiport SRAM cell, as known in the prior art.
Figure 2:
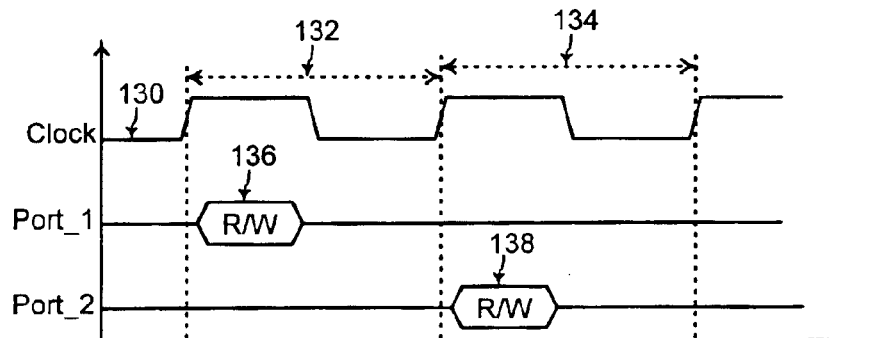
FIG. 2 shows a timing diagram of two read or write operations with each read or write operation being performed within a respective separate cycle of a clock signal, according to the prior art.
Figure 3:
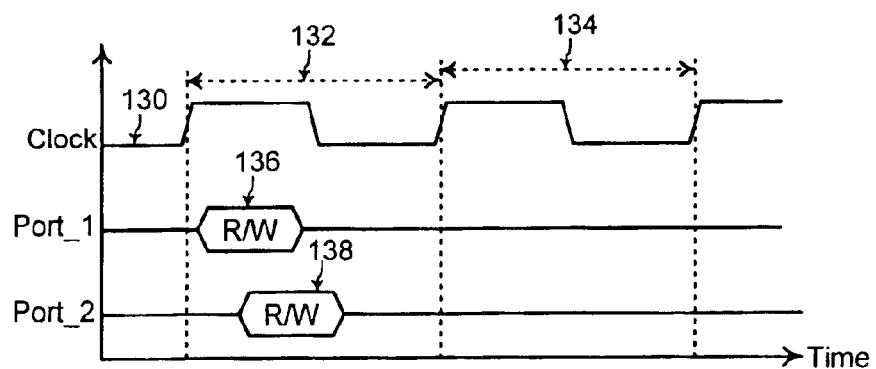
FIG. 3 shows a timing diagram of two read or write operations being performed within a same clock cycle with contention between such operations, according to the prior art.
Figure 4:
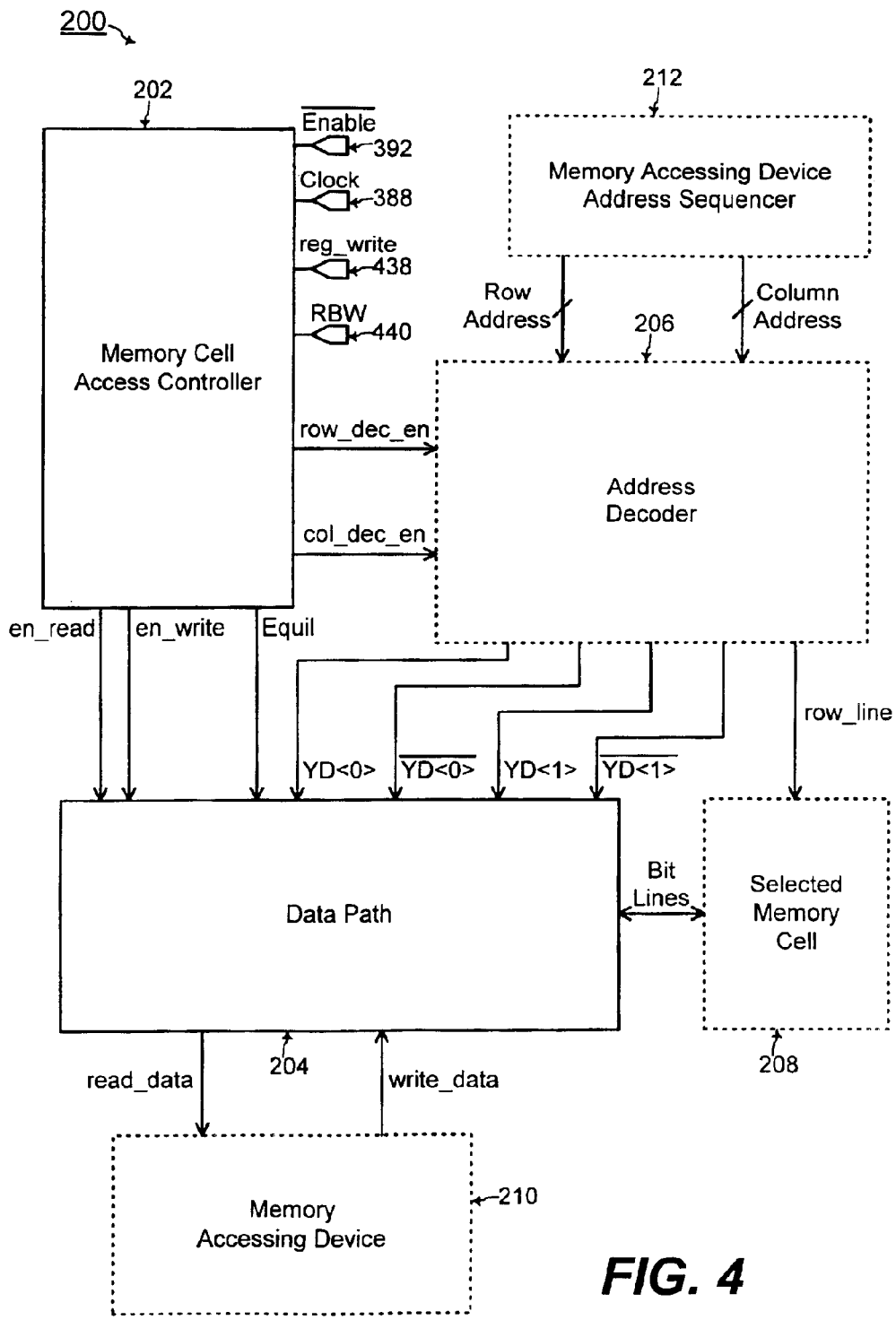
FIG. 4 shows a system block diagram of a memory cell access controller and a data path for synchronizing a read operation and a write operation to a memory cell within one clock cycle, according to an embodiment of the present invention.

Referring to FIG. 4, a system 200 for accessing a memory cell according to an embodiment of the present invention includes a memory cell access controller 202 and a data path 204. The memory cell access controller 202 is coupled to an address decoder 206 and the data path 204. The data path 204 is in turn coupled to the address decoder 206, a memory cell 208 to be accessed, and a memory accessing device 210. The address decoder 206 is coupled to a memory accessing device address sequencer 212.

The address decoder 206, the memory cell 208, the memory accessing device 210, and the memory accessing device address sequencer 212 are not part of the system 200 for accessing a memory cell 200 according to an embodiment of the present invention (and thus are shown outlined in dashed lines in FIG. 4). Rather, the address decoder 206, the memory cell 208, the memory accessing device 210, and the memory accessing device address sequencer 212 are external components that interact with the memory cell access controller 202 and the data path 204 comprising the system 200 of an embodiment of the present invention. Implementations for the address decoder 206, the memory cell 208, the memory accessing device 210, and the memory accessing device address sequencer 212 are known to one of ordinary skill in the art.

Further referring to FIG. 4, the address sequencer 212 of the memory accessing device 210 provides a row address and a column address to the address decoder 206 for indicating a selected memory cell of an array of memory cells to be accessed. The memory cell 208 of FIG. 4 is a selected memory cell of an array of a plurality of rows and columns of memory cells comprising a memory device.

The address decoder 206 decodes such row and column addresses from the address sequencer 212 to provide a row__line control signal to the memory cell 208 and bit line selection signals YD<0>, YD<0>* (i.e., the complement of YD<0>), YD<1>, and YD<1>* (i.e., the complement of YD<1>) to the data path 204. (Note that the "*" character as used herein after a signal indicates "signal-bar", i.e., the complement of the signal.) The address decoder 206 decodes such row and column addresses from the address sequencer 212 to provide the row_line control signal when the row_dec_en (row decode enable) control signal from the memory cell access controller 202 is asserted. Similarly, the address decoder 206 decodes such row and column addresses from the address sequencer 212 to provide the bit line selection signals YD<0>, YD<0>*, YD<1>, and YD<1>* when the col_dec_en (column decode enable) control signal from the memory cell access controller 202 is asserted.

When the row_line control signal and the bit line selection signals indicate the memory cell 208 to be accessed by the memory accessing device 210, the data path couples the memory accessing device to the memory cell 208. When the en_read (enable read) control signal is asserted by the memory cell access controller 202, the data path 204 couples the selected memory cell 208 to the memory accessing device 210 that reads data stored within the memory cell 208 via the data path 204. Alternatively, when the en_write (enable write) control signal is asserted by the memory cell access controller 202, the data path 204 couples the selected memory cell 208 to the memory accessing device 210 that writes data into the memory cell 208 via the data path 204.

Figure 5:
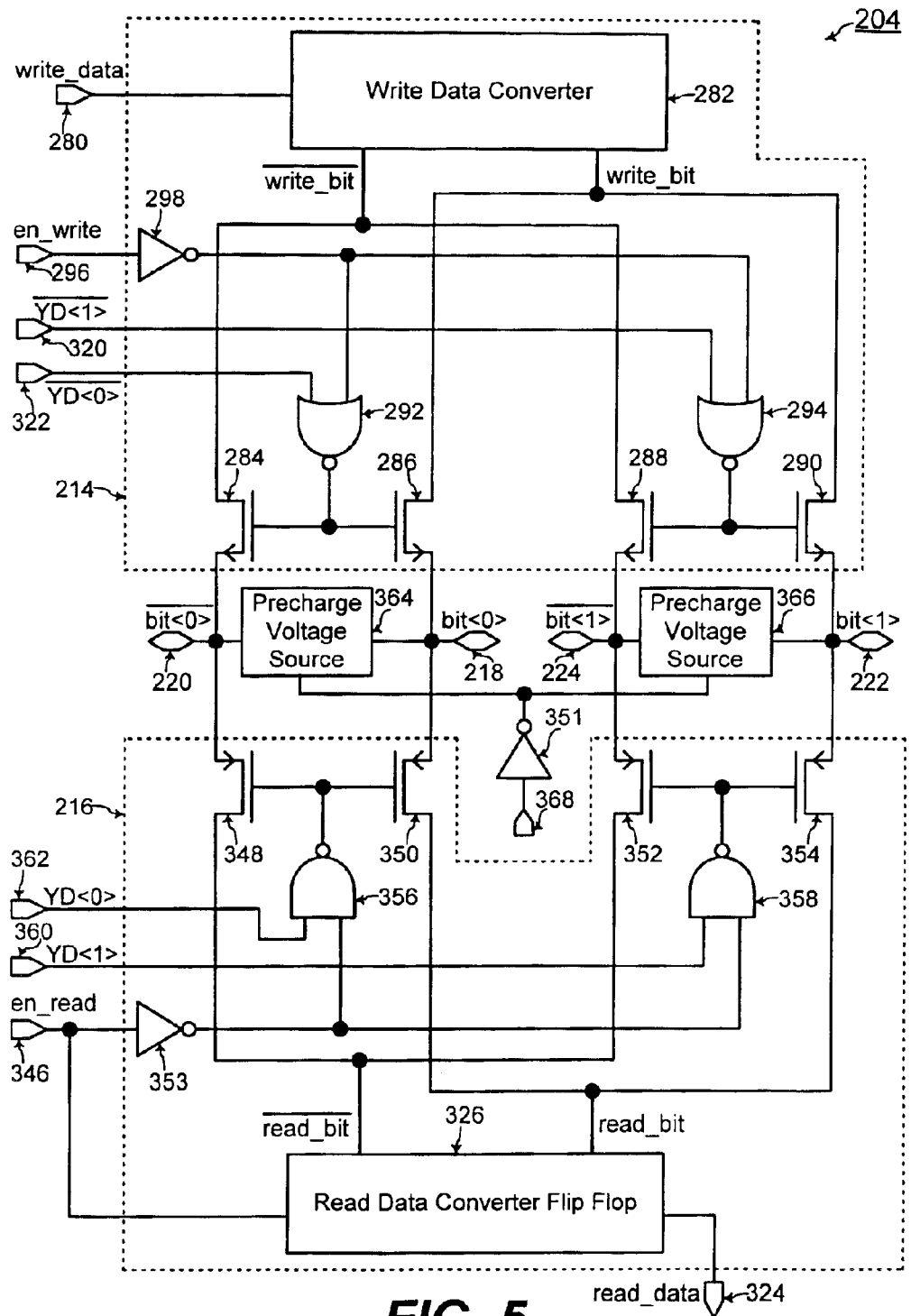
FIG. 5 shows an example embodiment of the data path of FIG. 4 for providing a read data path and a write data path to an example array of two memory cells, according to an embodiment of the present invention.

FIG. 5 shows an example implementation of the data path 204 according to an embodiment of the present invention. The data path 204 includes a write data path 214 (shown outlined with dashed lines in FIG. 5) and a read data path 216 (shown outlined with dashed lines in FIG. 5). The read data path 214 and the write data path 216 of FIG. 5 are for accessing two memory cells via a first pair of differential bit lines 218 and 220 for a double-ended port of a first memory cell and via a second pair of differential bit lines 222 and 224 for a double-ended port of a second memory cell.

Figure 6:
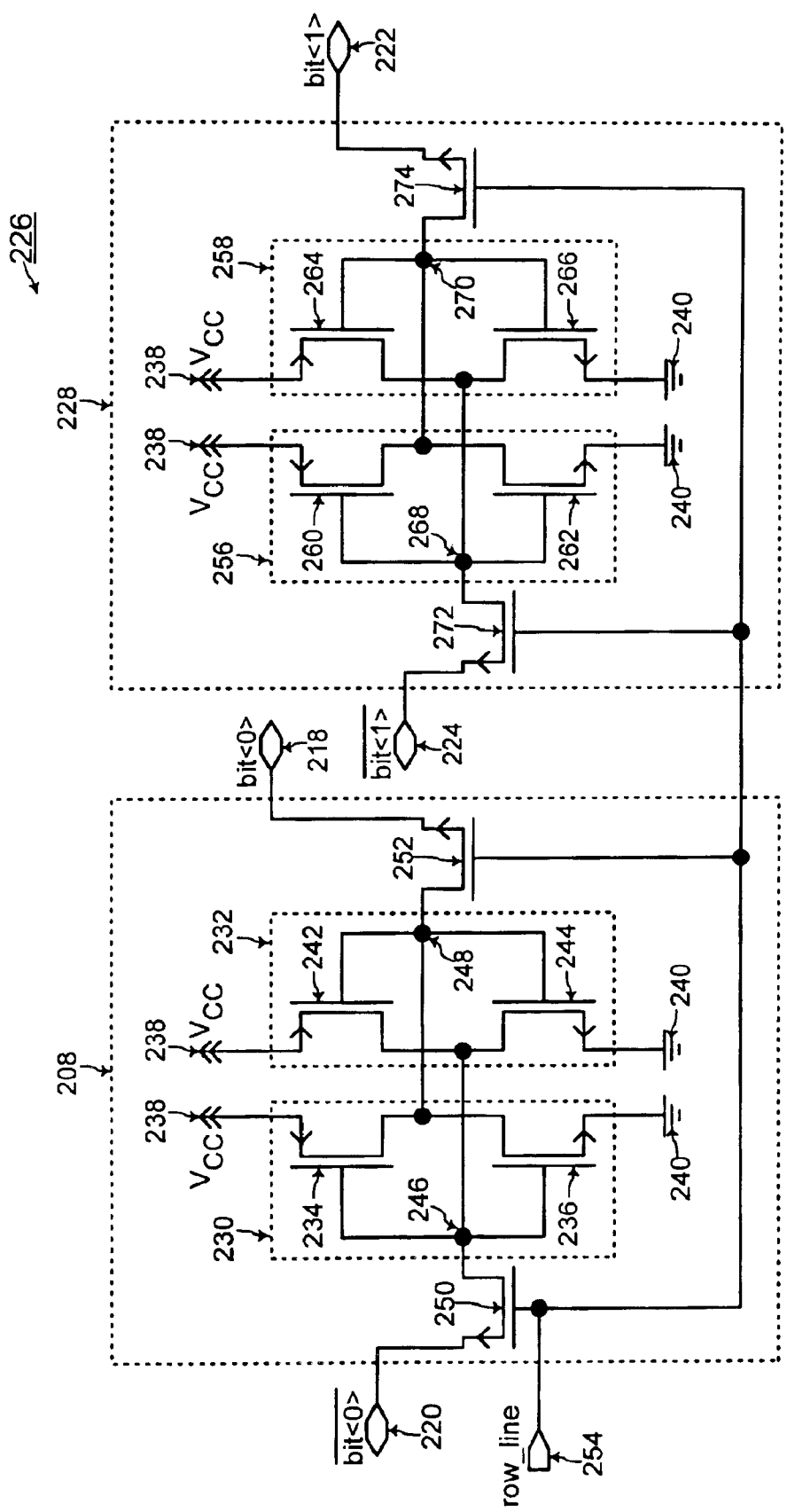
FIG. 6 shows an example implementation of an array of two SRAM (static random access memory) cells as the two memory cells accessed by the data path of FIG. 5, according to an embodiment of the present invention.

FIG. 6 shows an example array of SRAM (static random access memory) cells including a first SRAM cell 208 and a second SRAM cell 228 for being accessed by the data path 204 of FIG. 5. The first SRAM cell 208 includes a bistable loop of a first inverter 230 and a second inverter 232. The first inverter 230 is comprised of a first PMOSFET (P-channel metal oxide semiconductor field effect transistor) 234 and a first NMOSFET (N-channel metal oxide semiconductor field effect transistor) 236 coupled between a positive power supply $V_{CC}$ 238 and the ground node 240. The second inverter 232 is comprised of a second PMOSFET 242 and a second NMOSFET 244 coupled between the positive power supply $V_{CC}$ 238 and the ground node 240. The input of the first inverter 230 is coupled to the output of the second inverter 232 at a first bistable node 246, and the input of the second inverter 232 is coupled to the output of the first inverter 230 at a second bistable node 248. The first and second bistable nodes 246 and 248 of the first SRAM cell 208 store the data of the first SRAM cell 208, as known to one of ordinary skill in the art of electronics.

In addition, the first SRAM cell 208 includes a first pass transistor 250 having a drain coupled to the first bistable node 246 and having a source that is the differential bit line 220 coupled to the data path 204 of FIG. 5. The first SRAM cell 208 also includes a second pass transistor 252 having a drain coupled to the second bistable node 248 and having a source that is the differential bit line 218 coupled to the data path 204 of FIG. 5. The gates of the first and second pass transistors 250 and 252 of the first SRAM cell 208 are coupled together and to a row_line terminal 254 from the address decoder 206 of FIG. 4.

The first and second pass transistors 250 and 252 of the first SRAM cell 208 comprise a double-ended port of the first SRAM cell 208. The present invention may be practiced when the first SRAM cell 208 is a multiport SRAM cell having other ports. However, just the double-ended port of the first SRAM cell 208 comprised of the first and second pass transistors 250 and 252 to be accessed via the data path 204 of FIG. 5 is illustrated in FIG. 6 for clarity of illustration.

Similarly, the second SRAM cell 228 also includes a bistable loop of a first inverter 256 and a second inverter 258. The first inverter 256 of the second SRAM cell 228 is comprised of a first PMOSFET 260 and a first NMOSFET 262 coupled between the positive power supply $V_{CC}$ 238 and the ground node 240. The second inverter 258 of the second SRAM cell 258 is comprised of a second PMOSFET 264 and a second NMOSFET 266 coupled between the positive power supply $V_{CC}$ 238 and the ground node 240. The input of the first inverter 256 is coupled to the output of the second inverter 258 at a first bistable node 268 of the second SRAM cell 258, and the input of the second inverter 258 is coupled to the output of the first inverter 256 at a second bistable node 270 of the second SRAM cell 258. The first and second bistable nodes 268 and 270 of the second SRAM cell 228 store the data of the second SRAM cell 228, as known to one of ordinary skill in the art of electronics.

In addition, the second SRAM cell 228 includes a first pass transistor 272 having a drain coupled to the first bistable node 268 and having a source that is the differential bit line 224 coupled to the data path 204 of FIG. 5. The second SRAM cell 228 also includes a second pass transistor 274 having a drain coupled to the second bistable node 270 and having a source that is the differential bit line 222 coupled to the data path 204 of FIG. 5. The gates of the first and second pass transistors 272 and 274 of the second SRAM cell 228 are coupled together and to the row_line terminal 254 from the address decoder 206 of FIG. 4.

The first and second pass transistors 272 and 274 of the second SRAM cell 228 comprise a double-ended port of the second SRAM cell 228. The present invention may be practiced when the second SRAM cell 228 is a multiport SRAM cell having other ports. However, just the double-ended port of the second SRAM cell 228 comprised of the first and second pass transistors 272 and 274 to be accessed via the data path 204 of FIG. 5 is illustrated in FIG. 6 for clarity of illustration.

The address decoder 206 of FIG. 4 asserts the row_line control signal on the row_line terminal 254 to select the row including the first and second SRAM cells 208 and 228 for accessing one of the SRAM cells 208 and 228 in that row. The present invention may be practiced with more numerous memory cells as would be apparent to one of ordinary skill in the art from the description herein, but two memory cells 208 and 228 are illustrated and described herein for simplicity and clarity of illustration. In addition, the present invention may be practiced with other types of memory cells aside from just the example of SRAM cells, as would be apparent to one of ordinary skill in the art from the description herein.

Referring back to FIGS. 4 and 5, write data from the memory accessing device 210 is applied on a write data input terminal 280 coupled to a write data converter 282 within the write data path 214. The write data converter 282 converts the single-ended write data on the write data input terminal 280 to be differential write data bits, write_bit and write_bit* (i.e., the complement of write_bit).

Figure 8:
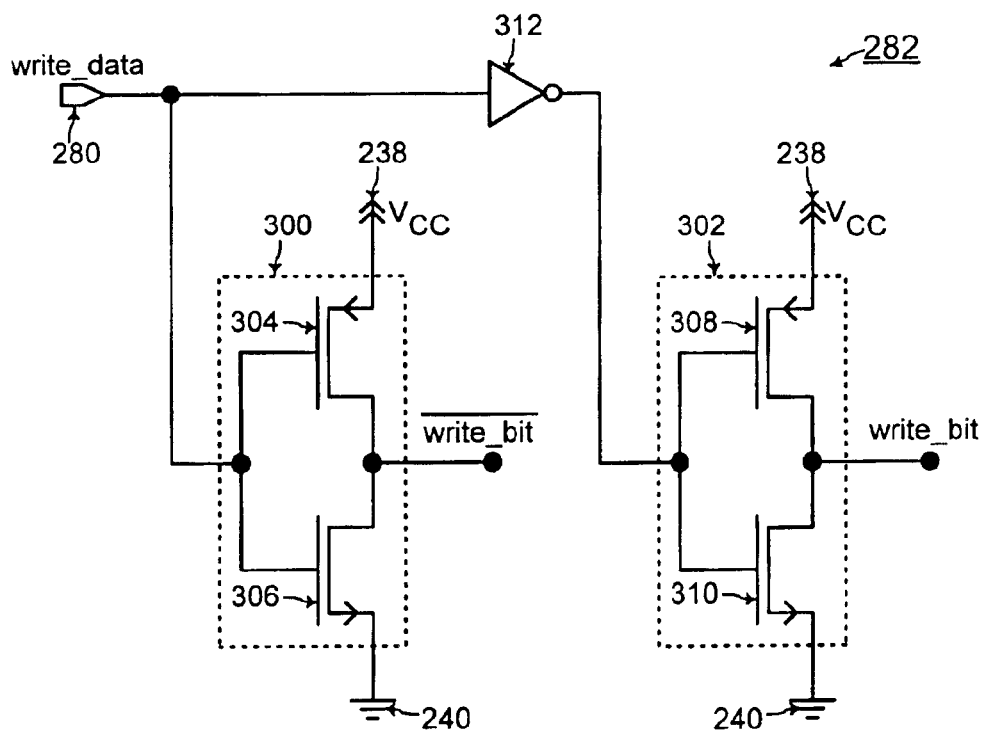
FIG. 8 shows an example embodiment of a write data converter within the data path of FIG. 5 for converting single-ended write data into differential write data bits to be applied on differential bit lines of the memory cell, according to an embodiment of the present invention.

FIG. 8 shows an example implementation for the write data converter 282 including a first inverter 300 and a second inverter 302. The first inverter 300 of the write data converter 282 is comprised of a first PMOSFET 304 and a first NMOSFET 306 coupled between the positive power supply $V_{CC}$ 238 and the ground node 240. The second inverter 302 of the write data converter 282 is comprised of a second PMOSFET 308 and a second NMOSFET 310 coupled between the positive power supply $V_{CC}$ 238 and the ground node 240.

The write_data on the write data input terminal 280 is coupled to the input of the first inverter 300, and the output of the first inverter 300 provides one of the differential write data bits (i.e., write_bit*). In addition, the write_data on the write data input terminal 280 is coupled via another inverter 312 to the input of the second inverter 302, and the output of the second inverter 302 provides the other of the differential write data bits (i.e., write_bit).

Referring to the data path 204 of FIG. 5, the differential write data bits (i.e., write_bit and write_bit*) are applied on the drains of a first differential pair of NMOSFETs 284 and 286, and the sources of such NMOSFETs 284 and 286 are coupled to the differential bit lines 220 and 218 of the first SRAM cell 208. In addition, the differential write data bits (i.e., write_bit and write_bit*) are also applied on the drains of a second differential pair of NMOSFETs 288 and 290, and the sources of such NMOSFETs 288 and 290 are coupled to the differential bit lines 224 and 222 of the second SRAM cell 228.

The gates of the first differential pair of NMOSFETs 284 and 286 are coupled together and to the output of a first NOR gate 292, and the gates of the second differential pair of NMOSFETs 288 and 290 are coupled together and to the output of a second NOR gate 294. An en_write (enable write) control signal from the memory cell access controller 202 of FIG. 4 is applied on an en_write input terminal 296 that is coupled via an inverter 298 to an input of the first NOR gate 292 and to an input of the second NOR gate 294. In addition, the bit line selection signal YD<1>* from the address decoder 206 of FIG. 4 is applied on a first bit line selection terminal 320 that is coupled to an input of the second NOR gate 294. Furthermore, the bit line selection signal YD<0>* from the address decoder 206 of FIG. 4 is applied on a second bit line selection terminal 322 that is coupled to an input of the first NOR gate 292.

Referring back to FIGS. 4, 5, and 6, read data from a selected one of the memory cells 208 and 228 is output to the memory accessing device 210 on a read data output terminal 324 coupled to a read data converter flip flop 326 within the read data path 216. The read data converter flip flop 326 converts the differential read data bits (read_bit and read_bit*, i.e., the complement of read_bit) from the differential bit lines of a selected one of the memory cells 208 and 228 to be single-ended for application on the single-ended read data output terminal 324.

Figure 9:
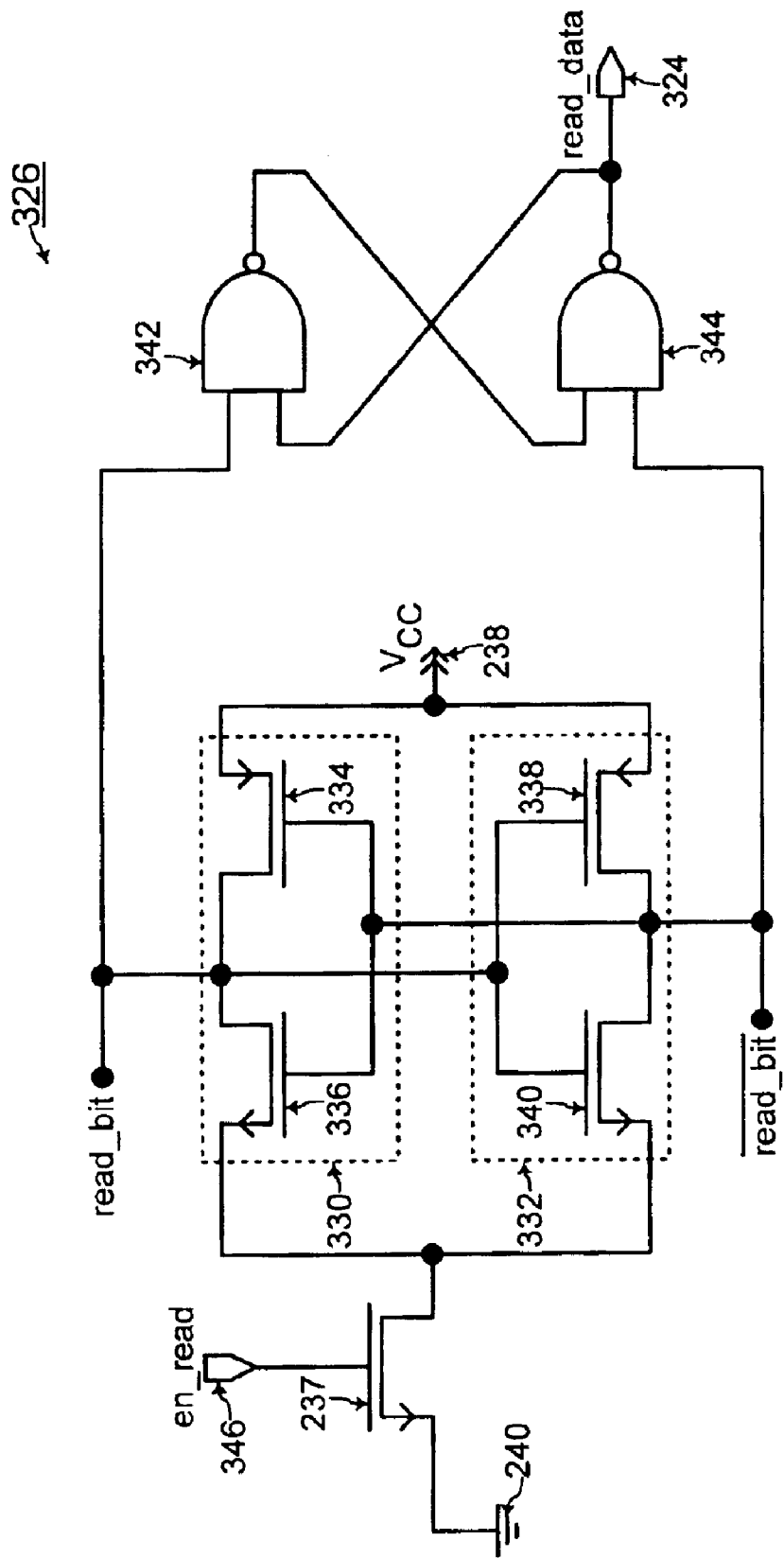
FIG. 9 shows an example embodiment of a read data converter flip flop within the data path of FIG. 5 for converting differential read data bits from the differential bit lines of the memory cell to be single-ended, according to an embodiment of the present invention.

FIG. 9 shows an example implementation for the read data converter flip flop 326 including a first inverter 330 and a second inverter 332. The first inverter 330 of the read data converter flip flop 326 is comprised of a first PMOSFET 334 and a first NMOSFET 336 coupled between the positive power supply $V_{CC}$ 238 and the ground node 240 via a pass transistor 237. The second inverter 332 of the read data converter flip flop 326 is comprised of a second PMOSFET 338 and a second NMOSFET 340 coupled between the positive power supply $V_{CC}$ 238 and the ground node 240 via the pass transistor 237.

In addition, within the read data converter flip flop 326, the input of the first inverter 330 is coupled to the output of the second inverter 332, and the input of the second inverter 332 is coupled to the output of the first inverter 330. The output of the first inverter 330 is coupled to an input of a first NAND gate 342, and the output of the second inverter 332 is coupled to an input of a second NAND gate 344. The output of the first NAND gate 342 is coupled to an input of the second NAND gate 344, and the output of the second NAND gate 344 is coupled to an input of the first NAND gate 342. The output of the second NAND gate 344 is coupled to the read data output terminal 324.

The gate of the pass transistor 237 of the read data converter flip flop 326 is coupled to a enable read terminal 346 having the en_read (enable read) control signal applied thereon. When the en_read control signal on the enable read terminal 346 is asserted, the read data converter flip flop 326 outputs the single-ended read data on the read data output terminal 324 with the single-ended read data being converted to be single-ended from the differential read data bits (read_bit and read_bit*). The differential read data bits (read_bit and read_bit*) are from the differential bit lines of a selected one of the memory cells 208 and 228.

Referring to the data path 204 of FIG. 5, the differential read data bits (i.e., read_bit and read_bit*) may be from the drains of a first differential pair of PMOSFETs 348 and 350, and the sources of such PMOSFETs 348 and 350 are coupled to the differential bit lines 220 and 218 of the first SRAM cell 208. In addition, the differential read data bits (i.e., read_bit and read_bit*) also may be from the drains of a second differential pair of PMOSFETs 352 and 354, and the sources of such PMOSFETs 352 and 354 are coupled to the differential bit lines 224 and 222 of the second SRAM cell 228.

The gates of the first differential pair of PMOSFETs 348 and 350 are coupled together and to the output of a first NAND gate 356, and the gates of the second differential pair of PMOSFETs 352 and 354 are coupled together and to the output of a second NAND gate 358. The en_read (enable read) control signal from the memory cell access controller 202 of FIG. 4 is applied on the en_read input terminal 346 that is coupled via an inverter 353 to an input of the first NAND gate 356 and to an input of the second NAND gate 358. In addition, the bit line selection signal YD<1> from the address decoder 206 of FIG. 4 is applied on a third bit line selection terminal 360 that is coupled to an input of the second NAND gate 358. Furthermore, the bit line selection signal YD<0> from the address decoder 206 of FIG. 4 is applied on a fourth bit line selection terminal 362 that is coupled to an input of the first NAND gate 356.

Further referring to FIG. 5, a first equilibrating precharge voltage source 364 is coupled to the differential bit lines 218 and 220 of the first SRAM cell 208, and a second equilibriating precharge voltage source 366 is coupled to the differential bit lines 222 and 224 of the second SRAM cell 228. The first and second equilibriating precharge voltage sources 364 and 366 are coupled via an inverter 351 to an equilibriating control terminal 368 having an equilibriating control signal (i.e., the Equil control signal) applied thereon.

Figure 7:
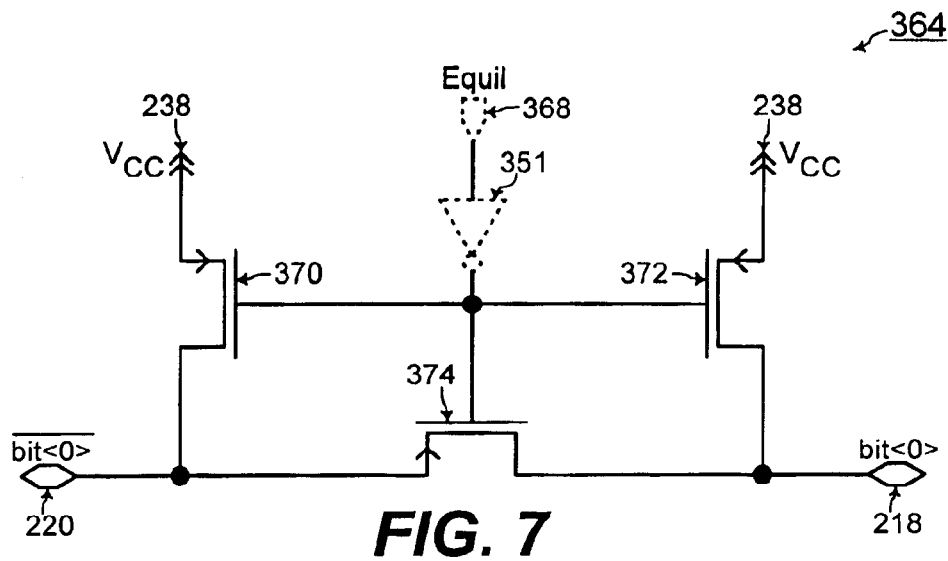
FIG. 7 shows an example embodiment of an equilibriating precharge voltage generator for applying an equilibriating precharge voltage on the bit lines of the memory cells of FIG. 6 within the data path of FIG. 5 when a read or write operation is not being performed, according to an embodiment of the present invention.

FIG. 7 shows an example implementation for the first precharge voltage source 364 including a first PMOSFET 370, a second PMOSFET 372, and a third PMOSFET 374. When the equilibriating control signal is asserted to be at the logical high state, the first, second, and third PMOSFETs 370, 372, and 374 are turned on such that a precharge voltage (i.e., the positive power supply voltage $V_{CC}$ in FIG. 7) is applied on each of the differential bit lines 218 and 220 of the first SRAM memory cell 208. On the other hand, when the equilibriating control signal is de-asserted to be at the logical low state, the first, second, and third PMOSFETs 370, 372, and 374 are turned off such that the precharge voltage (i.e., the positive power supply voltage $V_{CC}$ in FIG. 7) is isolated from each of the differential bit lines 218 and 220 of the first SRAM memory cell 208.

In addition, referring to FIGS. 5 and 7, the second precharge voltage source 366 is similarly implemented as the first precharge voltage source 364 of FIG. 7 for applying the precharge voltage (i.e., the positive power supply voltage $V_{CC}$ in FIG. 7) on each of the differential bit lines 222 and 224 of the second SRAM memory cell 228 when the equilibriating control signal is asserted to be at the logical high state or for isolating each of the differential bit lines 222 and 224 from the precharge voltage when the equilibriating control signal is de-asserted to be at the logical low state. Referring to FIGS. 4 and 5, the memory cell access controller 202 generates the Equil control signal.

Figure 10:
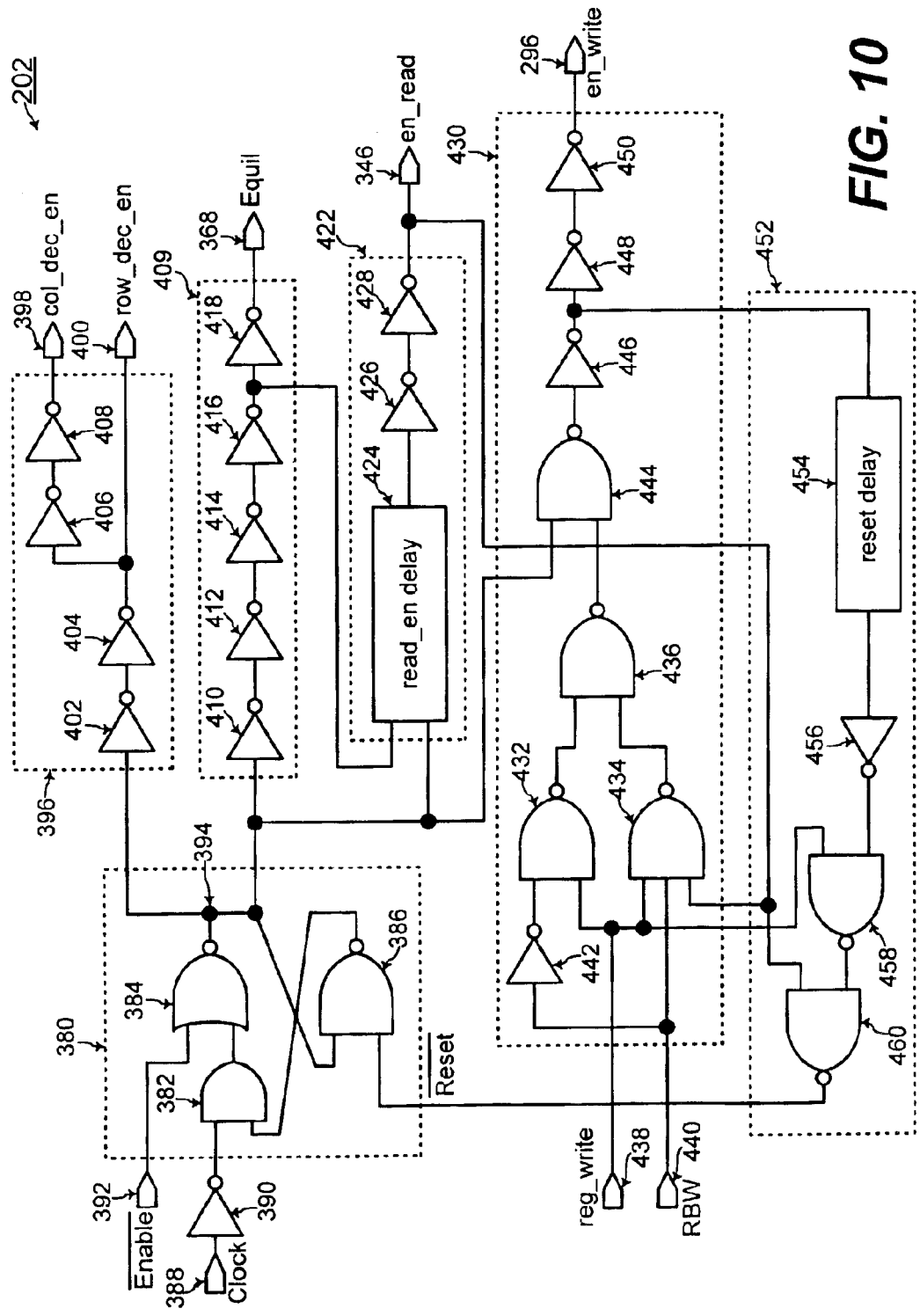
FIG. 10 shows an example embodiment of a memory cell access controller for synchronizing a read operation and a write operation to the memory cell within one clock cycle by generating enable read and write control signals used by the data path of FIG. 5, according to an embodiment of the present invention.

FIG. 10 shows an example implementation of the memory cell access controller 202 of FIG. 4. The memory cell access controller 202 includes a clock signal latch 380 (shown outlined with dashed lines in FIG. 10). The clock signal latch 380 includes an AND gate 382, a NAND gate 384, and a NOR gate 386 coupled in a flip flop configuration. A clock signal is applied on a clock input terminal 388 that is coupled via an inverter 390 to an input of the AND gate 382. An enable signal (i.e., Enable*) is applied on an enable input terminal 392 that is coupled to an input of the NOR gate 384. The output 394 of the clock signal latch 380 is the output of the NOR gate 384.

The output 394 of the clock signal latch 380 is coupled to an address decode enable signal generator 396 (shown outlined with dashed lines in FIG. 10) that generates the col_dec_en (column decode enable) control signal on a column decode enable output terminal 398 and that generates the row_dec_en (row decode enable) control signal on a row decode enable output terminal 400. The address decode enable signal generator 396 includes a plurality of inverters coupled in series including a first inverter 402, a second inverter 404, a third inverter 406, and a fourth inverter 408 coupled in series.

The output of the fourth inverter 408 is the col_dec_en control signal generated on the column decode enable output terminal 398. The output of the second inverter 404 is the row_dec_en control signal generated on the row decode enable output terminal 400. Referring to FIGS. 4 and 10, the row_dec_en control signal generated on the row decode enable output terminal 400 of the memory cell access controller 202 and the col_dec_en control signal generated on the column decode enable output terminal 398 of the memory cell access controller 202 are sent to the address decoder 206.

The output 394 of the clock signal latch 380 is also coupled to an equilibriating precharge control signal generator 409 (shown outlined with dashed lines in FIG. 10) that generates the equilibriating control signal (i.e., the Equil control signal) on the equilibriating control terminal 368. The equilibriating precharge control signal generator 409 is comprised of a plurality of inverters coupled in series including a fifth inverter 410, a sixth inverter 412, a seventh inverter 414, an eighth inverter 416, and a ninth inverter 418, coupled in series. The output of the ninth inverter 418 generates the Equil control signal on the equilibriating control terminal 368. Referring to FIGS. 4, 5, and 10, the Equil control signal generated on the equilibriating control terminal 368 is sent to the first and second equilibriating precharge voltage sources 364 and 366 via the inverter 351 within the data path 204.

The output 394 of the clock signal latch 380 is further coupled to an enable read control signal generator 422 (shown outlined with dashed lines in FIG. 10) that generates the en_read control signal (commonly referred to as a read strobe) on the enable read terminal 346. The enable read control signal generator 422 includes a read enable delay element 424, an eleventh inverter 426, and a twelfth inverter 428 coupled in series. The output of the eighth inverter 416 within the equilibriating precharge control signal generator 409 is also input by the read enable delay element 424. The output of the twelfth inverter 428 generates the en_read control signal on the enable read terminal 346.

The output 394 of the clock signal latch 380 is further coupled to an enable write control signal generator 430 (shown outlined with dashed lines in FIG. 10) that generates the en_write control signal on the enable write terminal 296. The enable write control signal generator 430 is comprised of a first NAND gate 432, a second NAND gate 434, a third NAND gate 436, and a fourth NAND gate 444. A reg_write control signal is applied on a reg_write terminal 438 that is coupled to an input of the first NAND gate 432 and to an input of the second NAND gate 434. The enable read control signal generated on the enable read terminal 346 is applied on an input of the second NAND gate 434. A RBW (read before write) control signal is applied on a RBW terminal 440 that is coupled via a thirteenth inverter 442 to an input of the first NAND gate 432 and that is coupled to an input of the second NAND gate 434.

The outputs of the first and second NAND gates 432 and 434 are coupled to inputs of the third NAND gate 436. The output of the third NAND gate 436 is coupled to an input of the fourth NAND gate 444, and the output 394 of the clock signal latch 380 is coupled to an input of the fourth NAND gate 444. The output of the fourth NAND gate 444 is coupled to the enable write terminal 296 via a series of inverters, including a fourteenth inverter 446, a fifteenth inverter 448, and a sixteenth inverter 450 coupled in series.

The memory cell access controller 202 of FIG. 10 includes a reset control signal generator 452 (shown outlined with dashed lines in FIG. 10) that generates a resetting control signal (i.e., Reset* control signal which is an active low control signal in one embodiment of the present invention). The reset control signal generator 452 includes a reset delay element 454, a seventeenth inverter 456, a fifth NAND gate 458, and a sixth NAND gate 460. The output of the fourteenth inverter 446 within the enable write control signal generator 430 is input by the reset delay element 454. The output of the reset delay element 454 is applied via the seventeenth inverter 456 on an input of the fifth NAND gate 458. The reg_write control signal from the reg_write terminal 438 is applied on an input of the fifth NAND gate 458. The output of the fifth NAND gate 458 is applied on an input of the sixth NAND gate 460. The enable read control signal generated on the enable read terminal 346 is applied to an input of the fifth NAND gate 458. The resetting control signal is generated at the output of the sixth NAND gate 406 that is applied on an input of the NAND gate 386 within the clock signal latch 380.

Figure 11:
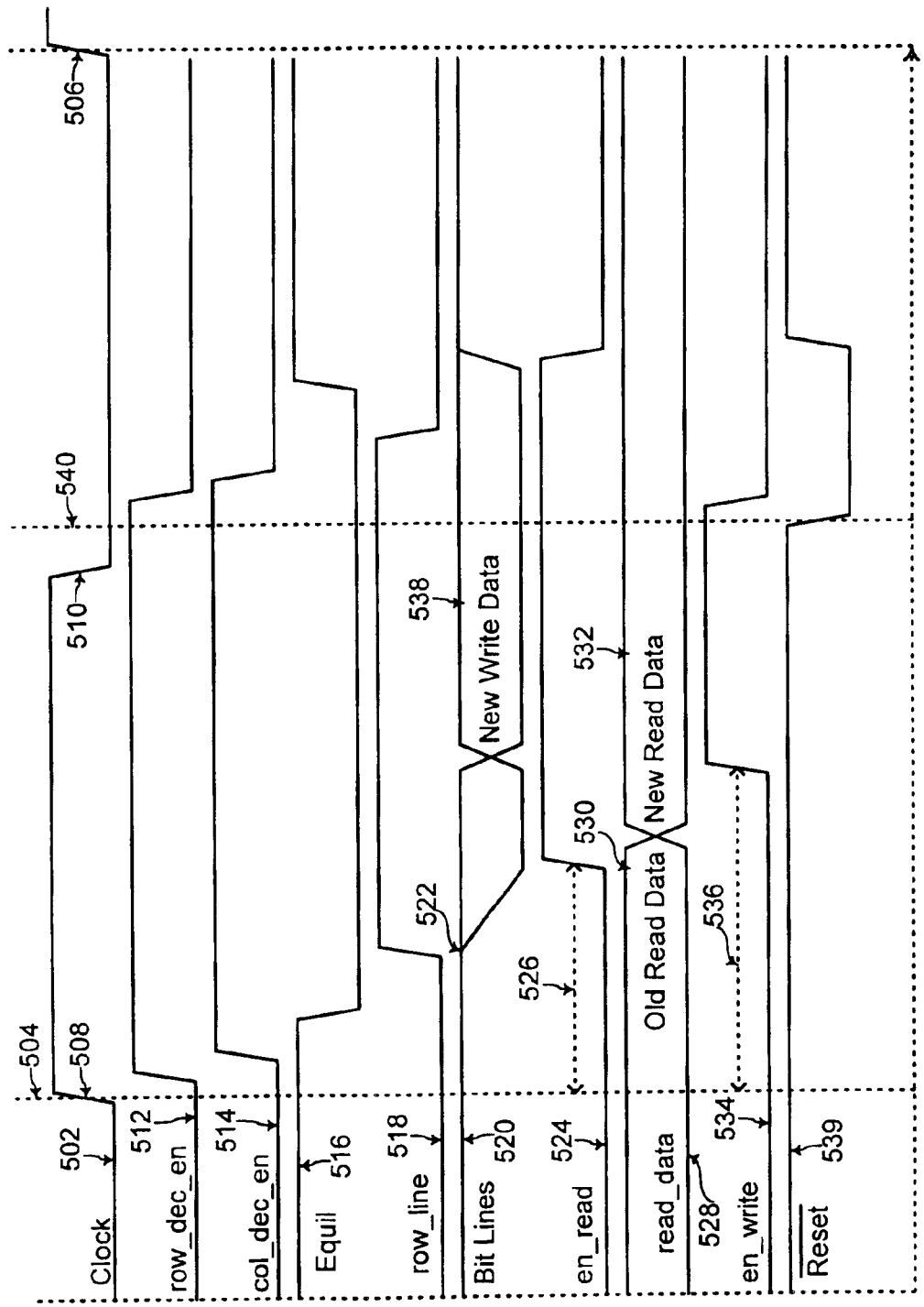
FIG. 11 shows a timing diagram for performing a read operation before a write operation with the read operation being stimulated from a leading edge of a clock signal cycle, according to an embodiment of the present invention.
Figure 12:
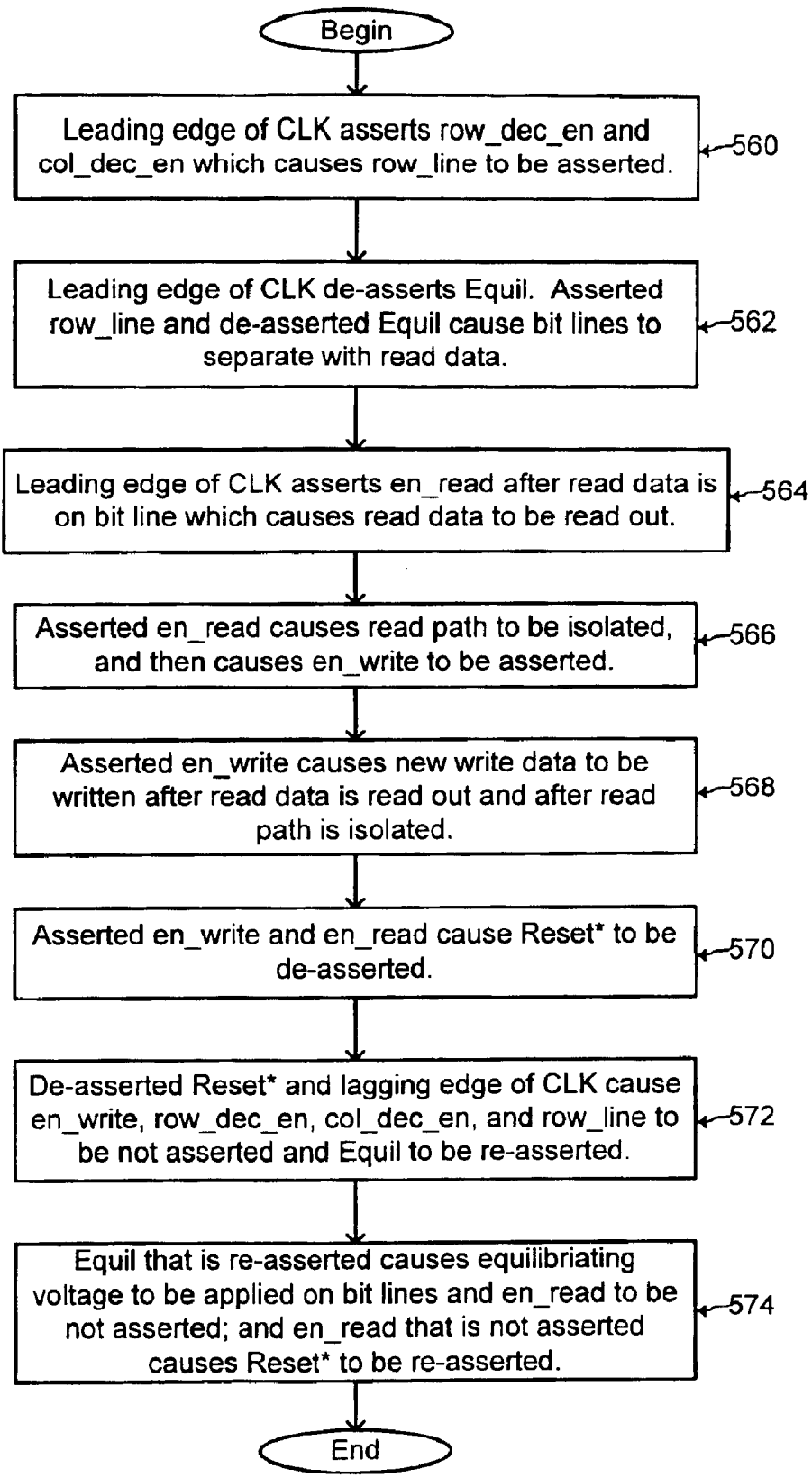
FIG. 12 shows a flow chart of steps for the timing diagram of FIG. 11 for performing the read operation before the write operation with the read operation being stimulated from the leading edge of the clock signal cycle, according to an embodiment of the present invention.

The operation of the memory cell access controller 202 of FIGS. 4 and 10 and of the data path 204 of FIGS. 4 and 5 for synchronizing a read operation and a write operation to a selected one of the memory cells 208 and 228 during one clock cycle is now described in reference to the timing diagram of FIG. 11 and the flowchart of FIG. 12. The timing diagram of FIG. 11 and the flowchart of FIG. 12 are for the case when a write operation is performed after a read operation via a same port of a memory cell with a leading edge of a clock signal cycle stimulating the read and write operations, according to one embodiment of the present invention.

Referring to the memory cell access controller 202 of FIG. 10, the Enabler* control signal applied on the enable input terminal 392 is at the logical low state (i.e., the "0" state), and the reg_write control signal applied on the reg_write terminal 438 is at the logical high state (i.e., the "1" state) during operation of the memory cell access controller 202 according to an embodiment of the present invention. Furthermore, for the embodiment of the present invention when the read operation is performed before the write operation within one clock signal cycle, the RBW (read before write) control signal applied on the RBW terminal 440 is asserted to the logical high state.

Referring to FIGS. 10 and 11, a clock signal 502 applied on the clock input terminal 388 is a periodic signal having a cycle from a beginning 504 of the clock signal cycle to an end 506 of the clock signal cycle. The clock signal 502 has a leading edge 508 at the beginning 504 of the clock signal cycle and has a lagging edge 510 at a middle of the clock signal cycle, according to one embodiment of the present invention. The leading edge 504 is a rising edge with the clock signal making a transition from the logical low state to the logical high state, and the lagging edge 510 is a falling edge with the clock signal making a transition from the logical high state to the logical low state, according to one embodiment of the present invention.

Referring to FIGS. 10 and 11, the leading edge 508 of the clock signal cycle is latched to the output 394 of the clock signal latch 380 and travels through the inverters 402, 404, 406, and 408 of the address decode enable signal generator 396. Thus, the row_dec_enable control signal 512 that is generated on the row decode enable output terminal 400 is asserted a predetermined delay from the leading edge 508 of the clock signal cycle from the delay through the first and second inverters 402 and 404 (step 560 of FIG. 12). Similarly, the col_dec_enable control signal 514 that is generated on the column decode enable output terminal 398 is asserted a predetermined delay from the leading edge 508 of the clock signal cycle from the delay through the first, second, third, and fourth inverters 402, 404, 406, and 408 (step 560 of FIG. 12). In addition, the equilibriating control signal (i.e., the Equil signal) 516 that is generated on the equilibriating control terminal 368 is de-asserted a predetermined delay from the leading edge 508 of the clock signal cycle from the delay through the fifth, sixth, seventh, eighth, and ninth inverters 410, 412, 414, 416, 418 (step 562 of FIG. 12).

Referring to FIGS. 4 and 6, when the row_dec_enable and col_dec_enable control signals 512 and 514 are asserted, the address decoder 206 decodes the row and column addresses from the memory accessing device address sequencer 212 to assert the row_line control signal 516 generated on the row_line terminal 254. In addition, when the row_dec_enable and col_dec_enable control signals 512 and 514 are asserted, the address decoder 206 decodes the row and column addresses from the memory accessing device address sequencer 212 to generate the bit line selection signals YD<0>, YD<0>*, YD<1>, and YD<1>* to the data path 204.

The bit line selection signal YD<0> is asserted to the logical high state while the bit line selection signal YD<1> is set to the logical low state for selecting the first SRAM cell 208 to access for the read and write operations. Alternatively, the bit line selection signal YD<0> is set to the logical low state while the bit line selection signal YD<1> is asserted to the logical high state for selecting the second SRAM cell 228 to access for the read and write operations. Assume that the bit line selection signal YD<0> is asserted to the logical high state while the bit line selection signal YD<1> is set to the logical low state for selecting the first SRAM cell 208 to access for the read and write operations. In that case, the bit line selection signal YD<0>* is set to the logical low state while the bit line selection signal YD<1>* is asserted to the logical high state.

Referring to FIGS. 5, 6, and 7, when the Equil signal 516 was asserted at the logical high state, the equilibriating precharge voltage sources 364 and 366 generate the equilibriating precharge voltage (i.e., $V_{CC}$) to be applied on the bit lines bit<0> 218, bit<0>* 220, bit<1> 222, and bit<1>* 224. On the other hand, when the Equil signal 516 is de-asserted to the logical low state, the respective sets of the PMOSFETs 370, 372, and 374 of each of the equilibriating precharge voltage sources 364 and 366 are turned off such that the equilibriating precharge voltage (i.e., $V_{CC}$) is isolated from the bit lines bit<0> 218 bit<0>* 220, bit<1> 222, and bit<1>* 224.

Referring to FIGS. 5, 6, and 11, after the Equil signal 516 is de-asserted to the logical low state and the row_line control signal 518 is asserted to the logical high state, the bit lines signals 520 of the selected SRAM cell begin to separate with the data stored within the selected SRAM cell (step 562 of FIG. 12) at time point 522. Assume that the first SRAM cell 208 is the selected SRAM cell with the bit line selection signal YD<0> being asserted to the logical high state and with the bit line selection signal YD<1> being set to the logical low state. The bit lines signals 520 in that case are the signals generated on the differential bit lines bit<0> 218 and bit<0>* 220 of the first SRAM cell 208.

Further referring to FIGS. 10 and 11, the leading edge 508 of the clock signal cycle is latched to the output 394 of the clock signal latch 380 and travels through the read enable delay element 424 and the eleventh and twelfth inverters 426 and 428. Thus, the en_read control signal 524 that is generated on the enable read terminal 346 is asserted a predetermined delay 526 from the leading edge 508 of the clock signal cycle from the delay through the read enable delay element 424 and the eleventh and twelfth inverters 426 and 428 (step 564 of FIG. 12).

The read enable delay element 424 provides delay to the signal traveling therein, and the amount of delay through the read enable delay element 424 is adjusted such that the en_read control signal 524 is asserted after the bit line signals 520 have separated and stabilized to the data stored within the selected SRAM cell from the asserted row_dec_en and col_dec_en control signals causing the address decoder 206 to generate the bit line selection signals YD<0>, YD<0>*, YD<1>, and YD<1>*.

Referring to FIG. 5, when the en_read control signal on the enable read terminal 346 was de-asserted to the logical low state with the bit line selection signal YD<0> being asserted to the logical high state, the first differential pair of PMOSFETs 348 and 350 within the read data path 216 was turned on to couple the bit line signals 520 on the differential bit lines bit<0> 218 and bit<0>* 220 to the read data converter flip flop 326 as the differential read data bits, read_bit and the read_bit*. Referring to the read data converter flip flop 326 of FIG. 9, the asserted en_read control signal on the enable read terminal 346 causes the read data converter flip flop 326 to convert the differential read data bits, read_bit and read_bit*, to the single-ended read_data signal 528 generated on the read data output terminal 324 (step 564 of FIG. 12).

Referring to FIG. 11, the single-ended read_data signal 528 generated on the read data output terminal 324 is old read data 530 until the asserted en_read control signal on the enable read terminal 346 causes the read data converter flip flop 326 to output the new read data 532 from the differential read data bits, read_bit and read_bit*, on the differential bit lines bit<0> 218 and bit<0>* 220. Referring to FIGS. 4, 5, and 10, in one embodiment of the present invention, the read enable delay element 424 is implemented as a tracking delay that tracks the delay of the address decoder 206 generating the properly decoded bit line selection signals YD<0>, YD<0>*, YD<1>, and YD<1>* and the delay for the proper differential read data bits, read_bit and read_bit*, appearing on the differential bit lines bit<0> 218 and bit<0>* 220. Furthermore, referring to FIG. 5, after the en_read control signal on the enable read terminal 346 is asserted to the logical high state, the first and second differential pairs of PMOSFETs 348, 350, 352, and 354 turn off to isolate the differential bit lines bit<0> 218 bit<0>* 220, bit<1> 222, and bit<1>* 224 from the read path 216.

Referring to FIGS. 10 and 11, because the RBW (read before write) control signal applied on the RBW terminal 440 is asserted to the logical high state, the asserted en_read control signal 524 that is an input to the second NAND gate 434 of the enable write control signal generator 430 causes the en_write control signal 534 to be asserted after a predetermined delay 536 from the beginning 504 of the clock signal cycle and after the en_read control signal 524 is asserted (step 566 of FIG. 12). Referring to FIGS. 5, 6, 8, and 11, the asserted en_write control signal applied on the enable write terminal 296 causes the differential write data bits, write_bit and write_bit* (produced by write data converter 282 from the single-ended write data on data input terminal 280) to be applied on the differential bit lines of the selected SRAM cell causing a write to occur.

Referring to FIG. 5, because the en_write control signal on the enable write terminal 296 is asserted to the logical high state and the bit line selection signal YD<0>* is asserted to the logical low state (assuming that the first SRAM cell 208 is the selected memory cell), the first differential pair of NMOSFETs 284 and 286 of the write data path 214 turn on to couple the differential write data bits, write_bit and write_bit*, to the differential bit lines bit<0> 218 and bit<0>* 220 of the first SRAM cell 208. Thus, the differential write data bits, write_bit and write_bit*, converted from the single-ended write data applied on the write data input terminal 280 are written into the first SRAM cell 208 (step 568 of FIG. 12) with the new write data 538 appearing on the differential bit lines bit<0> 218 and bit<0>* 220 as the bit line signals 520.

Referring to FIG. 11, the asserted en_read control signal 524 causes the en_write control signal 534 to be asserted after a delay through the second, third, and fourth NAND gates 434, 436, and 444 and through the fourteenth, fifteenth, and sixteenth inverters 446, 448, and 450. Such a delay between the en_read control signal 524 being asserted and the en_write control signal 534 being asserted is adjusted such that the new read data 532 as was stored in the selected memory cell 208 is read out via the read data output terminal 324 before the new write data 538 is written into the selected memory cell 208.

For example, with such a delay between the en_read control signal 524 being asserted and the en_write control signal 534 being asserted, the read data path 216 is ensured to be isolated from the differential bit lines bit<0> 218 and bit<0>* 220 before the en_write control signal 534 is asserted. Thus, contention between the read and write operations is prevented with the read data path not reading the new write data 538 with the priorly asserted en_read control signal 524. Mechanisms for adjusting such delay are known to one of ordinary skill in the art of electronics.

Referring to FIGS. 10 and 11, the asserted en_write control signal 534 and the asserted en_read control signal 524 which are inputs to the reset control signal generator 452 cause the resetting control signal 539 (i.e., the Reset* control signal that is an active low control signal in one embodiment of the present invention) at the output of the sixth NAND gate 460 to be de-asserted to the logical low state at a time point 540 that is delayed from the assertion of the en_write control signal 534 (step 570 of FIG. 12). The asserted en_write control signal 534 is delayed through the reset delay element 454, the seventeenth inverter 456, and the fifth and sixth NAND gates 458 and 460 such that the resetting control signal 539 is de-asserted a predetermined delay after the en_write control signal 534 is asserted. Such a delay element 454 and mechanisms for adjusting the delay through the delay element 454 are known to one of ordinary skill in the art of electronics.

The resetting control signal 539 from the output of the sixth NAND gate 460 is applied to an input of the NAND gate 386 of the clock signal latch 380. When the resetting control signal 539 from the output of the sixth NAND gate 460 is de-asserted and the clock signal 502 is de-asserted to the logical low state after the lagging edge 510 of the clock signal cycle, the output 394 of the clock signal latch 380 is de-asserted to the logical low state. Note that even if the resetting control signal 539 from the output of the sixth NAND gate 460 is de-asserted, if the clock signal is not de-asserted before the lagging edge 510 of the clock signal cycle, the output 394 of the clock signal latch 380 remains asserted to the logical high state until the lagging edge 510 of the clock signal cycle is reached.

In the example illustration of FIG. 11, the resetting control signal 539 is de-asserted at the time point 540 that is after the lagging edge 510 of the clock signal cycle. Thus, the output 394 of the clock signal latch 380 is de-asserted to the logical low state after the resetting control signal 539 is de-asserted at the time point 540. As a result, the en_write control signal 534, the row_dec_en control signal 512, the col_dec_en control signal 514, and the row_line control signal 518 are also de-asserted, and the Equil control signal 516 is re-asserted shortly after the resetting control signal 539 is de-asserted at the time point 540 (step 572 of FIG. 12).

Referring to FIGS. 5, 6, 7, and 11, the Equil control signal 516 that is re-asserted to the logical high state causes the respective set of PMOSFETs 370, 372, and 374 of each of the equilibriating precharge voltage sources 364 and 366 to apply the equilibriating precharge voltage (i.e., $V_{CC}$) to the differential bit lines bit<0> 218, bit<0>* 220, bit<1> 222, and bit<1>* 224. Thus, the bit line signals 520 on the differential bit lines bit<0> 218 and bit<0>* 220 of the selected SRAM cell 208 return to the equilibriating precharge voltage (i.e., $V_{CC}$) shortly after the Equil control signal 516 is re-asserted to the logical high state in FIG. 11 (step 574 of FIG. 12).

Furthermore, referring to FIG. 10, the complement of the Equil control signal 516 from the eighth inverter 416 of the equilibriating precharge control signal generator 409 is applied as an input to the read enable delay element 424.

Referring to FIGS. 10 and 11, the Equil control signal 516 that is re-asserted to the logical high state causes the en_read control signal 524 to be de-asserted to the logical low state (step 574 of FIG. 12). In addition, the en_read control signal 524 that is applied as an input to the sixth NAND gate 406 of the reset control signal generator 452 and that is de-asserted to the logical low state causes the resetting control signal 539 to be re-asserted to the logical high state.

In this manner, with the data path 204 of FIG. 5 and the memory cell access controller 202 of FIG. 10 of an embodiment of the present invention, the en_read control signal 524 and the en_write control signal 534 are asserted within the one clock signal cycle. Thus, the bandwidth of read and write operations is doubled from the prior art where each of the read operation and write operation are performed during separate clock signal cycles.

In addition, such a read operation and such a write operation are performed via the same double-ended port comprised of the differential bit lines bit<0> 218 and bit<0>* 220 of the selected SRAM cell 208. Furthermore, such a read operation and such a write operation are synchronized by control signals generated by the memory cell access controller 202 of FIG. 10 as illustrated in the timing diagram of FIG. 11 for controlling operation of the data path 204 of FIG. 5 to prevent contention between starting such read and write operations during the one clock signal cycle via the same double-ended port of the selected SRAM cell 208.

The timing diagram of FIG. 11 and the flowchart of FIG. 12 are for the read before write mode with the RBW (read before write) control signal applied on the RBW terminal 440 being asserted to the logical high state in the memory cell access controller 202 of FIG. 10. In that mode, the read operation as enabled by the asserted en_read control signal 524 occurs before the write operation as enabled by the asserted en_write control signal 534.

Figure 13:
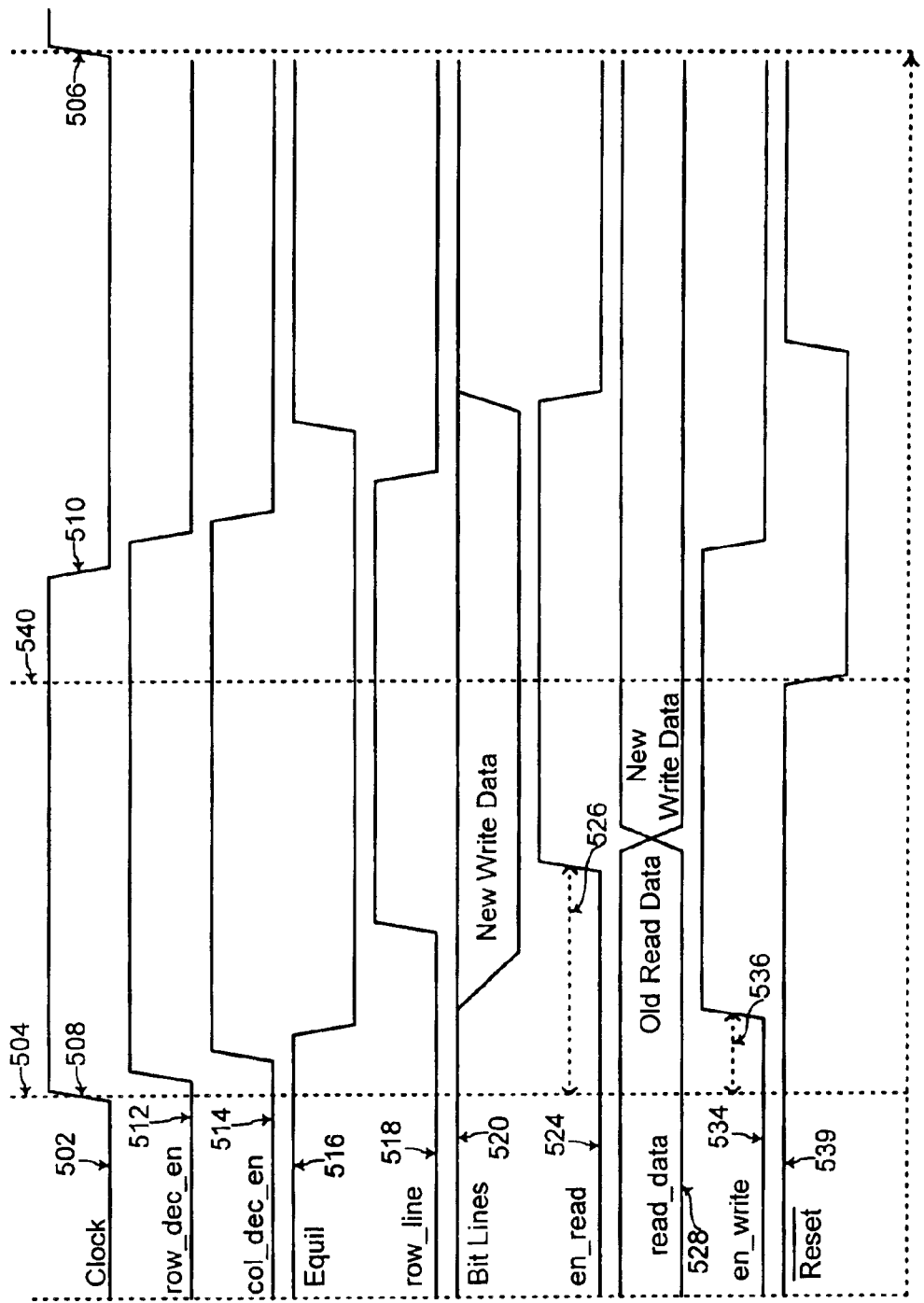
FIG. 13 shows a timing diagram for performing a read operation after a write operation with the read operation being stimulated from the leading edge of the clock signal cycle, according to an embodiment of the present invention.
Figure 14:
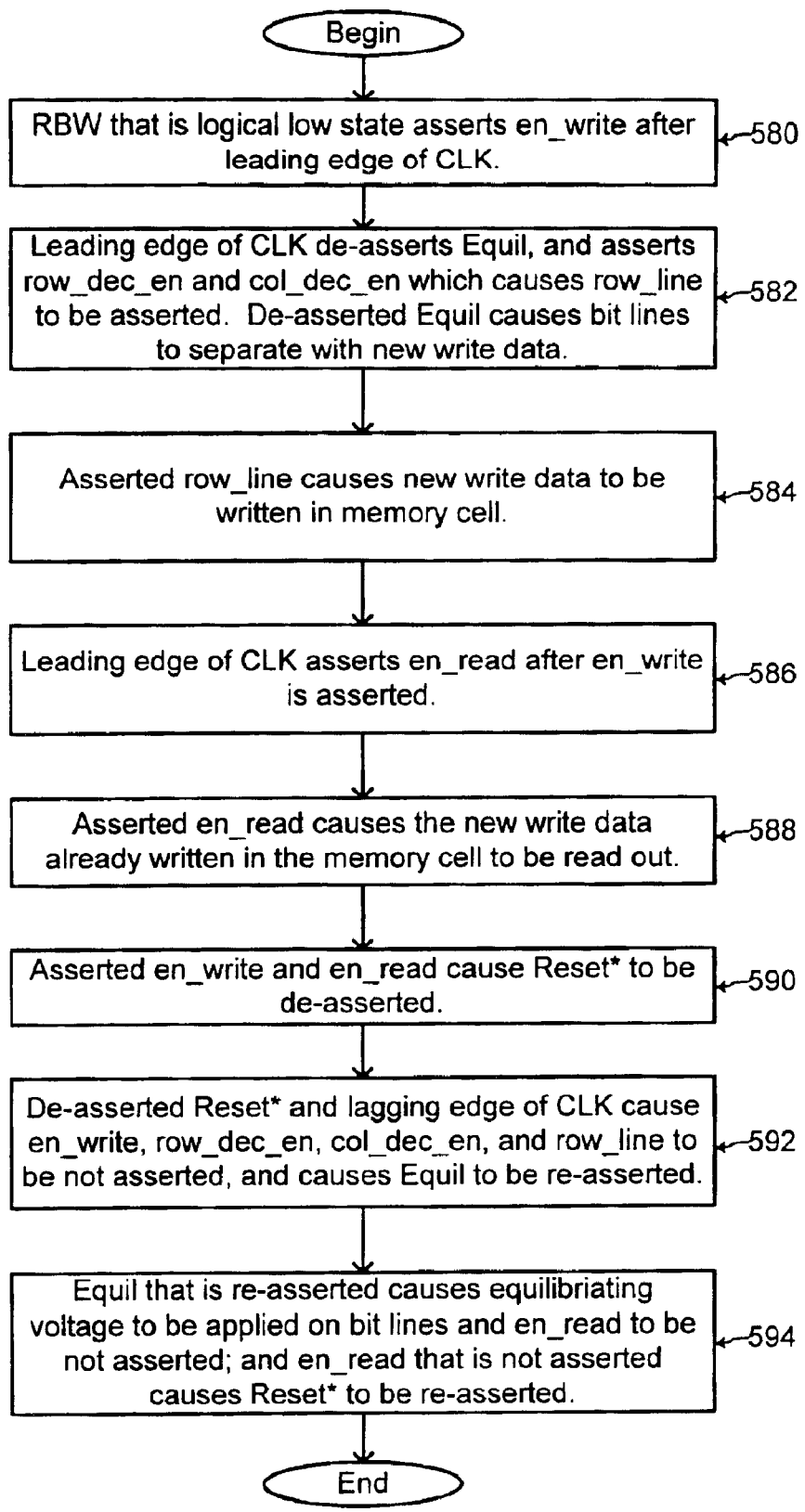
FIG. 14 shows a flow chart of steps for the timing diagram of FIG. 13 for performing the read operation after the write operation with the read operation being stimulated from the leading edge of the clock signal cycle, according to an embodiment of the present invention.

Alternatively, FIG. 13 shows a timing diagram and FIG. 14 shows a flowchart for a write before read mode with the RBW (read before write) control signal applied on the RBW terminal 440 being de-asserted to the logical low state in the memory cell access controller 202 of FIG. 10. Referring to FIGS. 10 and 11, because the RBW (read before write) control signal applied on the RBW terminal 440 is de-asserted to the logical low state, the leading edge 508 of the clock signal cycle causes the en_write control signal 534 generated by the enable write control signal generator 430 on the enable write terminal 296 to be asserted to the logical high state shortly after the leading edge 508 of the clock signal cycle (step 580 of FIG. 14). The en_write control signal 534 is asserted a predetermined delay 536 after the leading edge 508 of the clock signal cycle and typically after the Equil signal 516 is de-asserted to the logical low state.

In addition, the leading edge 508 of the clock signal cycle causes the row_dec_en control signal 512, the col_dec_en control signal 514, and the row_line control signal 518 to be asserted and the Equil signal 516 to be de-asserted (step 582 of FIG. 14), similarly as already described herein with reference to the timing diagram of FIG. 11. Referring to FIG. 13, the Equil control signal 516 that is de-asserted and the en_write control signal 534 that is asserted cause the bit line signals 520 of the differential bit lines bit<0> 218 and bit<0>* 220 of the selected SRAM cell 208 to separate to the new write data bits, write_bit and write_bit* as applied from the write data converter 282 (step 582 of FIG. 14). (In this write before read mode also, assume that the first SRAM cell 208 is selected for the read and write operations with the bit line selection signal YD<0> being asserted to the logical high state while the bit line selection signal YD<1> is set to the logical low state by the address decoder 206.)

Referring to FIG. 5, with the bit line selection signal YD<0>* being asserted to the logical low state and with the enable write control signal 534 being asserted to the logical high state, the first differential pair of NMOSFETs 284 and 286 of the write data path 214 are turned on to couple the new write data bits, write_bit and write_bit*, from the write data converter 282 to the differential bit lines bit<0> 218 and bit<0>* 220 of the selected SRAM cell 208. Then, when the row_line control signal 518 is asserted to the logical high state, the new write data bits, write_bit and write_bit*, on differential bit lines bit<0> 218 and bit<0>* 220 are written into the selected SRAM cell 208 (step 584 of FIG. 14). In one embodiment of the present invention, the row_line control signal 518 is asserted after the new write data bits, write_bit and write_bit*, are applied on the differential bit lines bit<0> 218 and bit<0>* 220 such that the new write data is written into the selected SRAM cell 208 more efficiently.

Further referring to FIGS. 10 and 13, the leading edge 508 of the clock signal cycle causes the en_read control signal 524 to be asserted after a predetermined delay 526 from the leading edge 508 of the clock signal cycle (step 586 of FIG. 14). In one embodiment of the present invention, the predetermined delay 526 from the leading edge 508 of the clock signal cycle when the en_read control signal 524 is asserted is substantially the same in both timing diagrams of FIGS. 11 and 13.

In the case of FIG. 13 however, the en_read control signal 524 is asserted after the new write data has been written into the selected memory cell 208 from the asserted en_write control signal 534 (step 586 of FIG. 14). The amount of delay through the read enable control signal generator 422 is adjusted such that the en_read control signal 524 is asserted after the new write data has been written into the selected memory cell 208 from the asserted en_write control signal 534. Mechanisms for adjusting the delay through the read enable control signal generator 422 are known to one of ordinary skill in the art of electronics.

Referring to FIGS. 5, 9, and 13, the asserted en_read control signal 524 causes the read data converter flip flop 326 to output the data currently stored within the selected memory cell 208 on the read data output terminal 324 (step 588 of FIG. 14). Because the new write data has been written into the selected memory cell 208 from the asserted en_write control signal 534 before the en_read control signal is asserted, the read data output on the read data output terminal 324 from the asserted en_read control signal 524 is the new write data that has already been written into the selected memory cell 208.

Referring to FIGS. 10 and 13, the asserted en_write control signal 534 and the asserted en_read control signal 524 which are inputs to the reset control signal generator 452 cause the resetting control signal 539 (i.e., the Reset* control signal that is an active low control signal in one embodiment of the present invention) at the output of the sixth NAND gate 460 to be de-asserted to the logical low state at a time point 540 (step 590 of FIG. 14). The resetting control signal 539 from the output of the sixth NAND gate 460 is applied to an input of the NAND gate 386 of the clock signal latch 380. When the resetting control signal 539 from the output of the sixth NAND gate 460 is de-asserted and the clock signal 502 is de-asserted to the logical low state after the lagging edge 510 of the clock signal cycle, the output 394 of the clock signal latch 380 is de-asserted to the logical low state. In the case of the timing diagram of FIG. 13, because the resetting control signal 539 is de-asserted before the lagging edge 510 of the clock signal cycle, the output 394 of the clock signal latch 380 is not de-asserted until the lagging edge 510 of the clock signal cycle.

As a result, in FIG. 13, the en_write control signal 534, the row_dec_en control signal 512, the col_dec_en control signal 514, and the row_line control signal 518 are also de-asserted, and the Equil control signal 516 is re-asserted, shortly after the lagging edge 510 of the clock signal cycle (step 592 of FIG. 14). Referring to FIGS. 5, 6, 7, and 13, the Equil control signal 516 that is re-asserted to the logical high state causes the respective set of PMOSFETs 370, 372, and 374 of each of the equilibriating precharge voltage sources 364 and 366 to apply the equilibriating precharge voltage (i.e., $V_{CC}$) to the differential bit lines bit<0> 218, bit<0>* 220, bit<1> 222, and bit<1>* 224. Thus, the bit line signals 520 on the differential bit lines bit<0> 218 and bit<0>* 220 of the selected SRAM cell 208 return to the equilibriating precharge voltage (i.e., $V_{CC}$) shortly after the Equil control signal 516 is re-asserted to the logical high state in FIG. 13 (step 594 of FIG. 14).

Referring to FIGS. 10 and 13, the Equil control signal 516 that is re-asserted to the logical high state causes the en_read control signal 524 to be de-asserted to the logical low state (step 594 of FIG. 14). In addition, the en_read control signal 524 that is applied as an input to the sixth NAND gate 406 of the reset control signal generator 452 and that is de-asserted to the logical low state causes the resetting control signal 539 to be re-asserted to the logical high state in FIG. 13.

In this manner, for the write before read mode with the RBW (read before write) control signal applied on the RBW terminal 440 de-asserted to the logical low state in the memory cell access controller 202 of FIG. 10, the write operation is performed before the read operation for the selected memory cell 208. In this mode also, the en_read control signal 524 and the en_write control signal 534 are asserted within the one clock signal cycle. Thus, the bandwidth of the read and write operations is doubled from the prior art where each of the read operation and write operation are performed during separate clock signal cycles.

In addition, such a read operation and such a write operation are performed via the same double-ended port comprised of the differential bit lines bit<0> 218 and bit<0>* 220 of the selected SRAM cell 208. Furthermore, such a read operation and such a write operation are synchronized by control signals generated by the memory cell access controller 202 of FIG. 10 as illustrated in the timing diagram of FIG. 13 for controlling operation of the data path 204 of FIG. 5 to prevent contention between starting such read and write operations during the one clock signal cycle via the same double-ended port of the selected SRAM cell 208.

Figure 15:
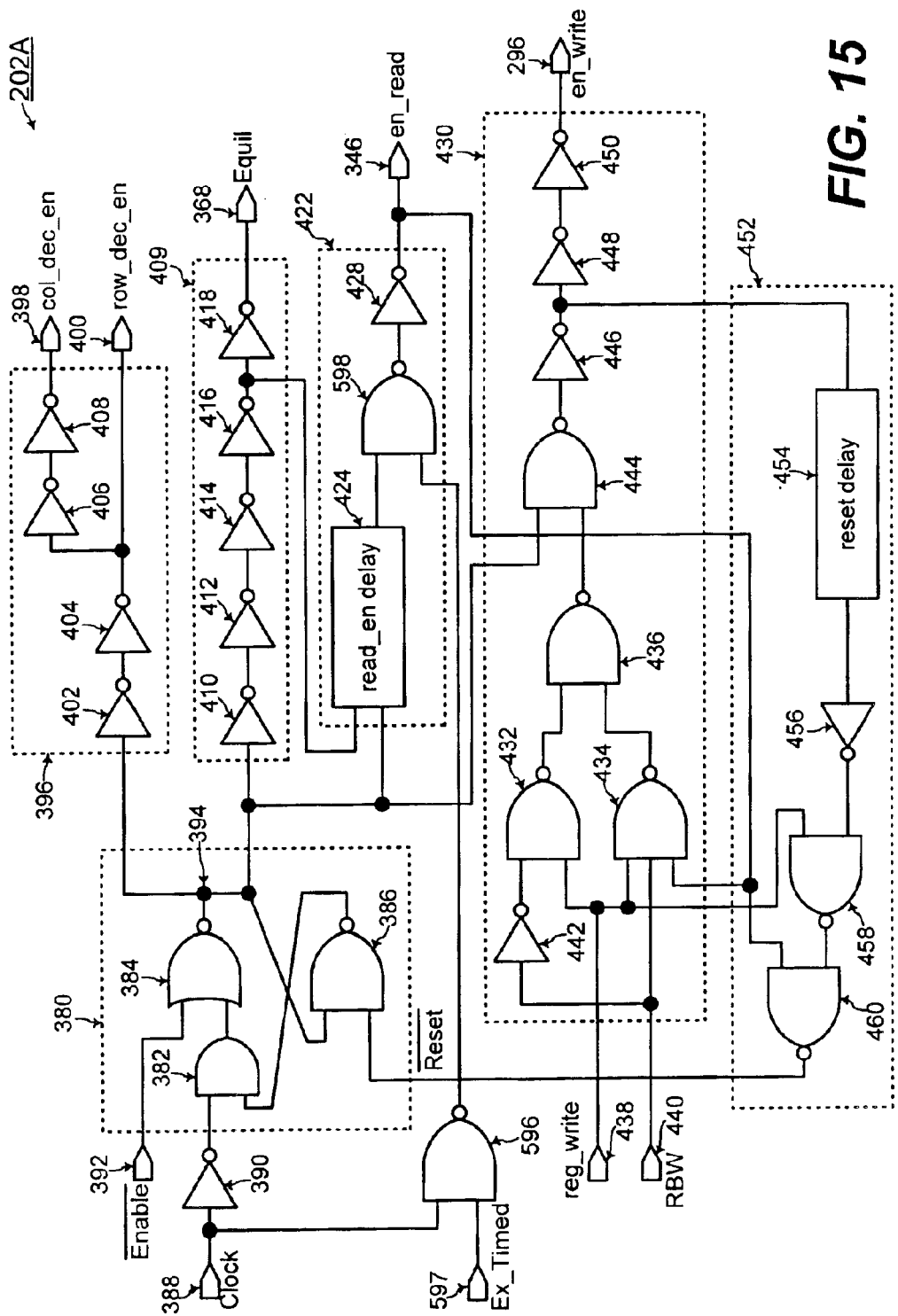
FIG. 15 shows another embodiment of the memory cell access controller for synchronizing a read operation and a write operation to the memory cell within one clock cycle by controlling the enable read control signal to be generated after a lagging edge of the clock signal cycle, according to an embodiment of the present invention.

For the embodiments of the timing diagrams of FIGS. 11 and 13 with the memory cell access controller 202 of FIG. 10, the en_read control signal 524 is asserted at a predetermined delay 526 from the leading edge 508 of the clock signal cycle but before the lagging edge 510 of the clock signal cycle. FIG. 15 shows an alternative embodiment of the memory cell access controller 202A for asserting the en_read control signal 524 at a predetermined delay after the lagging edge 510 of the clock signal cycle. Comparing the alternative memory cell access controller 202A of FIG. 15 to the memory cell access controller 202 of FIG. 10, the alternative memory cell access controller 202A of FIG. 15 further includes a lagging edge controller comprised of an added NAND gate 596 and comprised of a NAND gate 598 that replaces the eleventh inverter 426 within the enable read control signal generator 422. Otherwise, elements having the same reference number in FIGS. 10 and 15 refer to elements having similar structure and function.

Further referring to FIG. 15, an external timed control signal is applied on an external timed input terminal 597 that is an input to the added NAND gate 596. The clock signal applied on the clock input terminal 388 is also an input to the added NAND gate 596. Furthermore, the output of the added NAND gate 596 is an input to the NAND gate 598 within the enable read control signal generator 422. In addition, the output of the read enable delay element 424 is an input to the NAND gate 598 within the enable read control signal generator 422.

When the external timed control signal applied on the external timed input terminal 597 is set to the logical low state, the alternative memory cell access controller 202A of FIG. 15 operates similarly to the memory cell access controller 202 of FIG. 10 asserting the en_read control signal from the leading edge 508 of the clock signal cycle according to FIGS. 11 or 13 as already described herein. However, when the external timed control signal applied on the external timed input terminal 597 is set to the logical high state in the alternative memory cell access controller 202A of FIG. 15, the enable read control signal generator 422 asserts the en_read control signal from the lagging edge 510 of the clock signal cycle.

Figure 16:
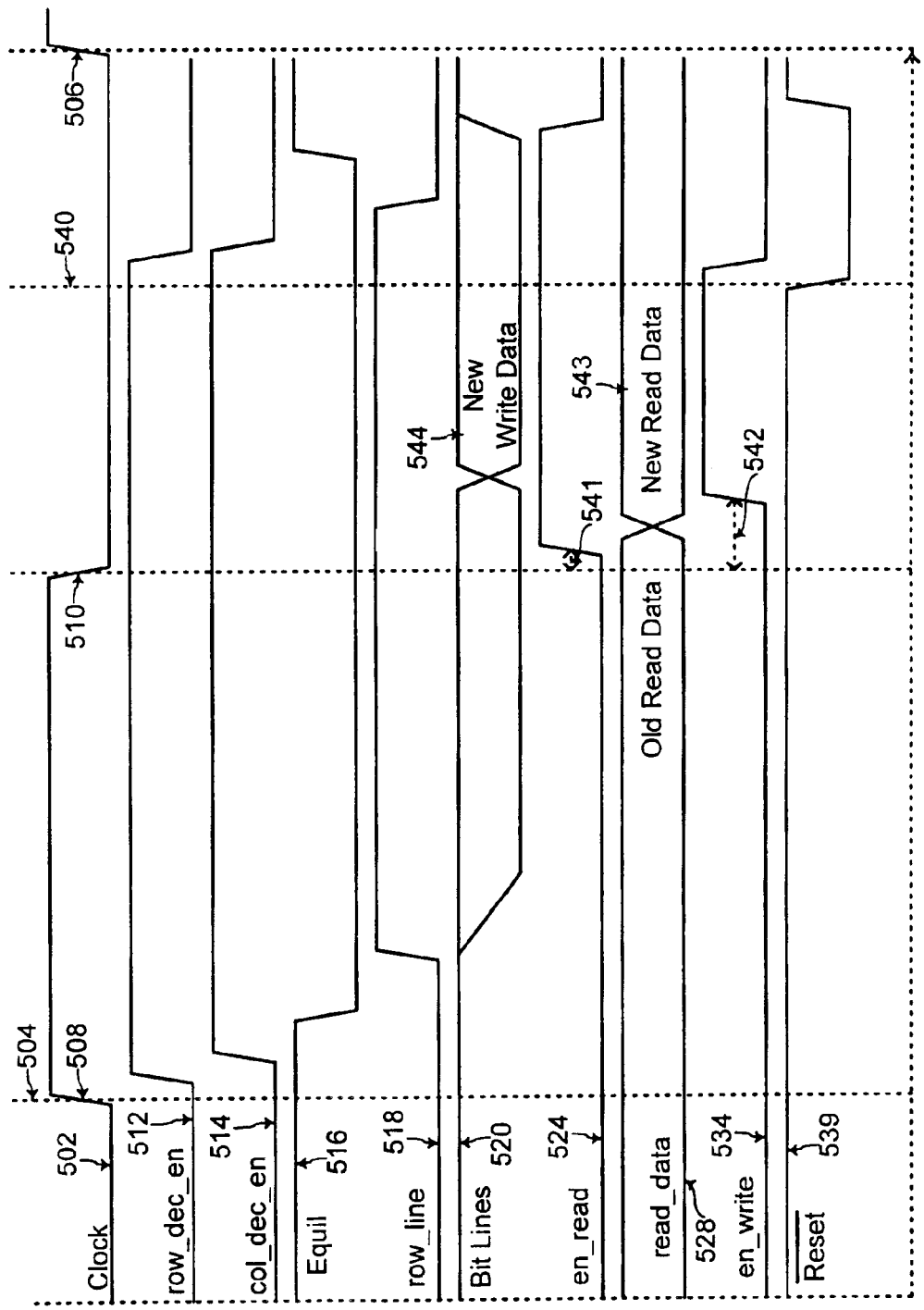
FIG. 16 shows a timing diagram for performing a read operation before a write operation with the read operation being stimulated from the lagging edge of the clock signal cycle, according to an embodiment of the present invention.
Figure 17:
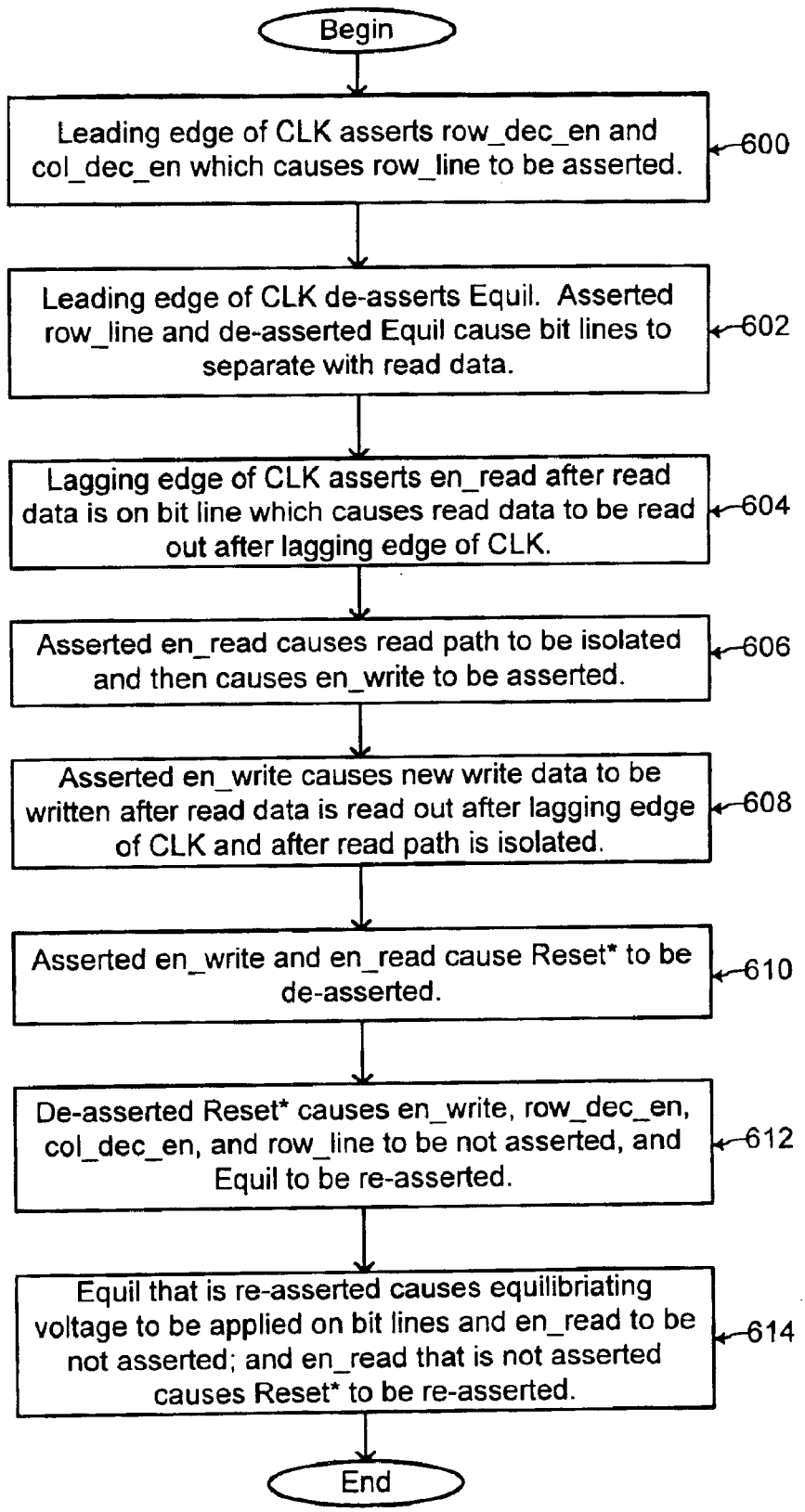
FIG. 17 shows a flow chart of steps for the timing diagram of FIG. 16 for performing the read operation before the write operation-with the read operation being stimulated from the lagging edge of the clock signal cycle, according to an embodiment of the present invention.

FIG. 16 is a timing diagram and FIG. 17 is a flowchart of operation of the alternative memory cell access controller 202A of FIG. 15 and the data path of FIG. 5 when the external timed control signal applied on the external timed input terminal 597 is set to the logical high state and when the RBW (read before write) control signal applied on the RBW terminal 440 is asserted to the logical high state. Referring to FIGS. 15 and 16, the leading edge 508 of the clock signal cycle causes the row_dec_en control signal 512, the col_dec_en control signal 514, and the row_line control signal 518 to be asserted and the Equil control signal 516 to be de-asserted (steps 600 and 602 of FIG. 17), similarly as already described herein with reference to the timing diagram of FIG. 11.

Referring to FIG. 16, the Equil control signal 516 that is de-asserted causes the bit line signals 520 of the differential bit lines bit<0> 218 and bit<0>* 220 of the selected SRAM cell 208 to separate to the read data bits, read_bit and read_bit*, stored within the selected SRAM cell 208 (step 602 of FIG. 17). (In this embodiment also, assume that the first SRAM cell 208 is selected for the read and write operations with the bit line selection signal YD<0> being asserted to the logical high state while the bit line selection signal YD<1> is set to the logical low state by the address decoder 206.)

Referring to FIGS. 15 and 16, because the external timed control signal applied on the external timed input terminal 597 is set to the logical high state in the alternative memory cell access controller 202A of FIG. 15, the lagging edge 510 of the clock signal cycle causes the read enable control signal generator 422 to assert the en_read control signal 524 a predetermined delay 541 after the lagging edge 510 of the clock signal cycle (step 604 of FIG. 16). Referring to the data path of FIGS. 5 and 9, the en_read control signal 524 that was de-asserted causes the first differential pair of PMOSFETs 348 and 350 of the read data path 216 to turn on to couple the read_bit and read_bit* on the differential bit lines bit<0> 218 and bit<0>* 220 to the read data converter flip flop 326.

Then, the asserted en_read control signal 524 causes the read data converter flip flop 326 to output as single-ended, the new read data 543 on the read data output terminal 324 that is converted to be single-ended from the differential read data bits, read_bit and read_bit*, on the differential bit lines bit<0> 218 and bit<0>* 220 (step 604 of FIG. 17). In addition, referring to FIG. 5, after the en_read control signal on the enable read terminal 346 is asserted to the logical high state, the first and second differential pairs of PMOSFETs 348, 350, 352, and 354 turn off to isolate the differential bit lines bit<0> 218 bit<0>* 220, bit<1> 222, and bit<1>* 224 from the read path 216.

Referring to FIGS. 15 and 16, because the RBW (read before write) control signal applied on the RBW terminal 440 is asserted to the logical high state, the asserted en_read control signal 524 causes the en_write control signal 534 to be asserted a predetermined delay 542 after the lagging edge 510 of the clock signal cycle and after the en_read control signal 524 is asserted (step 606 of FIG. 17). Referring to FIGS. 5, 6, 8, and 16, the asserted en_write control signal 534 applied on the enable write terminal 296 causes the write data converter 282 to convert the single-ended write data applied on the write data input terminal 280 to be differential write data bits, write_bit and write_bit*, applied on the differential bit lines bit<0> 218 and bit<0>* 220 of the selected SRAM cell 208.

Referring to FIG. 5, because the en_write control signal on the enable write terminal 296 is asserted to the logical high state and the bit line selection signal YD<0>* is asserted to the logical low state (assuming that the first SRAM cell 208 is the selected memory cell), the first differential pair of NMOSFETs 284 and 286 of the write data path 214 turn on to couple the differential write data bits, write_bit and write_bit*, to the differential bit lines bit<0> 218 and bit<0>* 220 of the selected SRAM cell 208. Thus, the differential write data bits, write_bit and write_bit*, converted from the single-ended write data applied on the write data input terminal 280 is written into the selected SRAM cell 208 (step 608 of FIG. 17) with the new write data 544 appearing on the differential bit lines bit<0> 218 and bit<0>* 220 as the bit line signals 520.

Referring to FIG. 16, the asserted en_read control signal 524 causes the en_write control signal 534 to be asserted after a delay through the second, third, and fourth NAND gates 434, 436, and 444 and through the fourteenth, fifteenth, and sixteenth inverters 446, 448, and 450 of the enable write control signal generator 430. Such a delay between the en_read control signal 524 being asserted and the en_write control signal 534 being asserted may be adjusted such that the new read data 543 as was stored in the selected memory cell 208 is read out via the read data output terminal 324 from the asserted en_read control signal 524 before the new write data 544 is written into the selected memory cell 208.

For example, with such a delay between the en_read control signal 524 being asserted and the en_write control signal 534 being asserted, the read data path 216 is ensured to be isolated from the differential bit lines bit<0> 218 and bit<0>* 220 before the en_write control signal 534 is asserted. Thus, contention between the read and write operations is prevented with the read data path not reading the new write data 538 with the priorly asserted en_read control signal 524. Mechanisms for adjusting such a delay are known to one of ordinary skill in the art of electronics.

Referring to FIGS. 15 and 16, the asserted en_write control signal 534 and the asserted en_read control signal 524 which are inputs to the reset control signal generator 452 cause the resetting control signal 539 (i.e., the Reset* control signal that is an active low control signal in one embodiment of the present invention) at the output of the sixth NAND gate 460 to be de-asserted to the logical low state at a time point 540 that is delayed from the assertion of the en_write control signal 534, similarly as already described herein with reference to FIG. 11 (step 610 of FIG. 17). When the resetting control signal 539 from the output of the sixth NAND gate 460 is de-asserted and after the clock signal 502 is de-asserted to the logical low state after the lagging edge 510 of the clock signal cycle, the output 394 of the clock signal latch 380 is deasserted to the logical low state.

In the example illustration of FIG. 16, the resetting control signal 539 is de-asserted at the time point 540 that is after the lagging edge 510 of the clock signal cycle. As a result, the en_write control signal 534, the row_dec_en control signal 512, the col_dec_en control signal 514, and the row_line control signal 518 are also de-asserted, and the Equil control signal 516 is re-asserted, shortly after the resetting control signal 539 is asserted at the time point 540, similarly as already described herein with reference to FIG. 11 (step 612 of FIG. 17).

Referring to FIGS. 5, 6, 7, and 16, the Equil control signal 516 that is re-asserted to the logical high state causes the respective set of PMOSFETs 370, 372, and 374 of each of the equilibriating precharge voltage sources 364 and 366 to apply the equilibriating precharge voltage (i.e., $V_{CC}$) to the differential bit lines bit<0> 218, bit<0>* 220, bit<1> 222, and bit <1>* 224. Thus, the bit line signals 520 on the differential bit lines bit<0> 218 and bit<0>* 220 of the selected SRAM cell 208 return to the equilibriating precharge voltage (i.e., $V_{CC}$) shortly after the Equil control signal 516 is re-asserted to the logical high state in FIG. 16 (step 614 of FIG. 17). Furthermore, referring to FIGS. 15 and 16, the Equil control signal 516 that is re-asserted to the logical high state causes the en_read control signal 524 to be de-asserted to the logical low state (step 614 of FIG. 17). In addition, the en_read control signal 524 that is de-asserted to the logical low state causes the resetting control signal 539 to be re-asserted to the logical high state.

In this manner, with the data path 204 of FIG. 5 and the alternative memory cell access controller 202A of FIG. 15 of an embodiment of the present invention, the read operation as enabled by the asserted en_read control signal 524 and the write operation as enabled by the asserted en_write control signal 534 are performed after the lagging edge 510 of the clock signal cycle and are performed during the one clock signal cycle. Thus, the bandwidth of such operations is doubled from the prior art where each of the read operation and write operation are performed during separate clock signal cycles.

In addition, such a read operation and such a write operation are performed via the same double-ended port comprised of the differential bit lines bit<0> 218 and bit<0>* 220 of the selected SRAM cell 208. Furthermore, such a read operation and such a write operation are synchronized by control signals generated by the alternative memory cell access controller 202A of FIG. 15 as illustrated in the timing diagram of FIG. 16 for controlling operation of the data path 204 of FIG. 5 to prevent contention between such read and write operations during the one clock signal cycle via the same double-ended port of the selected SRAM cell 208.

The timing diagram of FIG. 16 and the flowchart of FIG. 17 are for the read before write mode with the RBW (read before write) control signal applied on the RBW terminal 440 asserted to the logical high state in the alternative memory cell access controller 202A of FIG. 15. In that mode, the read operation as enabled by the asserted en_read control signal 524 occurs before the write operation as enabled by the asserted en_write control signal 534 with both the read and write operations occurring after the lagging edge 510 of the clock signal cycle with the alternative memory cell access controller 202A of FIG. 15.

Figure 18:
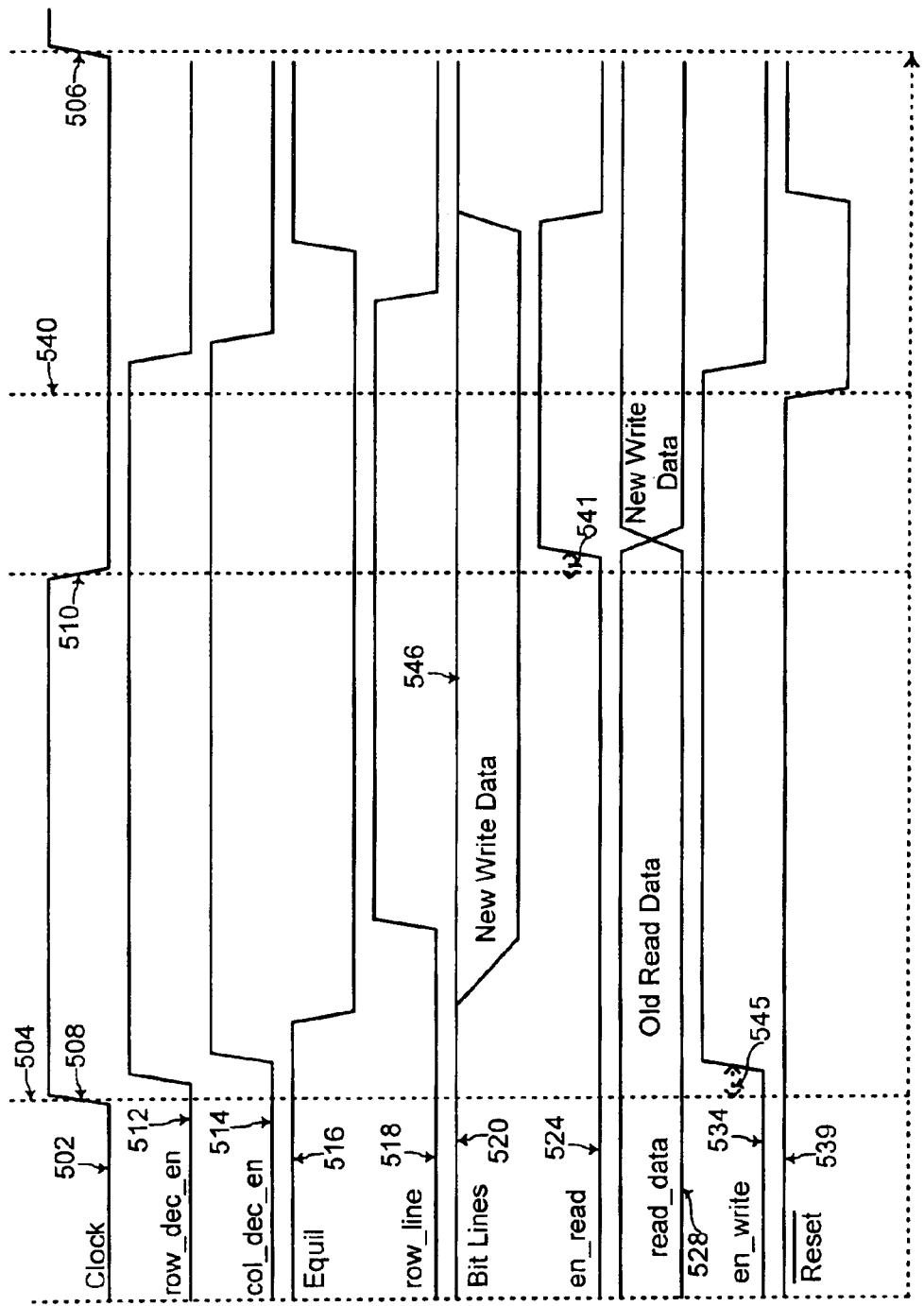
FIG. 18 shows a timing diagram for performing a read operation after a write operation with the read operation being stimulated from the lagging edge of the clock signal cycle, according to an embodiment of the present invention.
Figure 19:
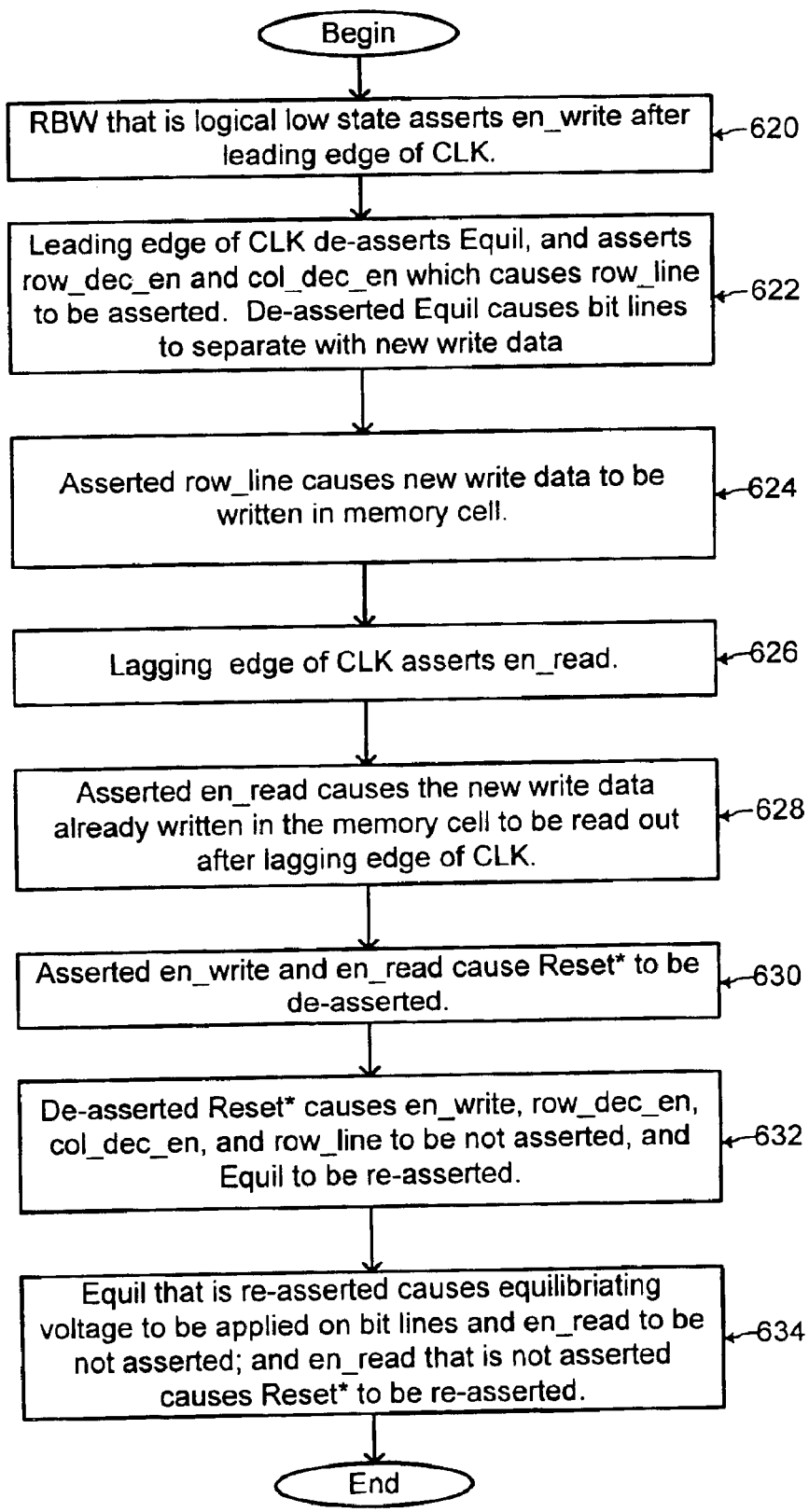
FIG. 19 shows a flow chart of steps for the timing diagram of FIG. 18 for performing the read operation after the write operation with the read operation being stimulated from the lagging edge of the clock signal cycle, according to an embodiment of the present invention.

Alternatively, FIG. 18 shows a timing diagram and FIG. 19 shows a flowchart for a write before read mode with the RBW (read before write) control signal applied on the RBW terminal 440 de-asserted to the logical low state in the alternative memory cell access controller 202A of FIG. 15. Referring to FIGS. 15 and 18, because the RBW (read before write) control signal applied on the RBW terminal 440 is de-asserted to the logical low state, the leading edge 508 of the clock signal cycle causes the en_write control signal 534 to be asserted to the logical high state shortly after the leading edge 508 of the clock signal cycle (step 620 of FIG. 19). The en_write control signal 534 is asserted a predetermined delay 545 after the leading edge 508 of the clock signal cycle and before the lagging edge 510 of the clock signal cycle.

In addition, the leading edge 508 of the clock signal cycle causes the row_dec_en control signal 512, the col_dec_en control signal 514, and the row_line control signal 518 to be asserted and the Equil control signal 516 to be de-asserted (step 622 of FIG. 19), similarly as already described herein with reference to the timing diagram of FIG. 11. Referring to FIG. 18, the Equil control signal 516 that is de-asserted and the en_write control signal 534 that is asserted cause the bit line signals 520 of the differential bit lines bit<0> 218 and bit<0>* 220 of the selected SRAM cell 208 to separate to the new write data bits, write_bit and write_bit*, as applied from the write data converter 282 (step 622 of FIG. 19). (In this write before read mode with the alternative memory cell access controller 202A of FIG. 15, assume that the first SRAM cell 208 is selected for the read and write operations with the bit line selection signal YD<0> being asserted to the logical high state while the bit line selection signal YD<1> is set to the logical low state by the address decoder 206.)

Referring to FIG. 5, with the bit line selection signal YD<0>* being asserted to the logical low state and with the en_write control signal 534 being asserted to the logical high state, the first differential pair of NMOSFETs 284 and 286 of the write data path 214 are turned on to couple the new write data bits, write_bit and write_bit*, from the write data converter 282 to the differential bit lines bit<0> 218 and bit<0>* 220 of the selected SRAM cell 208. Then, when the row_line control signal 518 is asserted to the logical high state, the new write data bits, write_bit and write_bit*, on differential bit lines bit<0> 218 and bit<0>* 220 are written into the selected SRAM cell 208 as new write data 546 (step 624 of FIG. 19). In one embodiment of the present invention, the row_line control signal 518 is asserted after the new write data bits, write_bit and write_bit*, are applied on the differential bit lines bit<0> 218 and bit<0>* 220 such that the new write data is written into the selected SRAM cell 208 more efficiently.

Further referring to FIGS. 15 and 18, the lagging edge 510 of the clock signal cycle causes the en_read control signal 524 to be asserted after a predetermined delay 541 from the lagging edge 510 of the clock signal cycle (step 626 of FIG. 19). In one embodiment of the present invention, the pre-determined delay 541 from the lagging edge 510 of the clock signal cycle when the en_read control signal 524 is asserted is substantially the same in both timing diagrams of FIGS. 16 and 18. In the case of FIG. 18 however, the en_read control signal 524 is asserted after the new write data has been written into the selected memory cell 208 from the asserted en_write control signal 534 before the lagging edge 510 of the clock signal cycle.

Referring to FIGS. 5, 9, and 18, the asserted en_read control signal 524 causes the read data converter flip flop 326 to output the data currently stored within the selected memory cell on the read data output terminal 324 (step 628 of FIG. 19). Because the new write data 546 has been written into the selected memory cell 208 from the asserted en_write control signal 534 before the lagging edge 510 of the clock signal cycle, the read data output on the read data output terminal 324 from the asserted en_read control signal 524 after the lagging edge 510 of the clock signal cycle is the new write data that has already been written into the selected memory cell 208 before the lagging edge 510 of the clock signal cycle.

Referring to FIGS. 15 and 18, the asserted en_write control signal 534 and the asserted en_read control signal 524 which are inputs to the reset control signal generator 452 cause the resetting control signal 539 (i.e., the Reset* control signal that is an active low control signal in one embodiment of the present invention) at the output of the sixth NAND gate 460 to be de-asserted to the logical low state at a time point 540 (step 630 of FIG. 19). The resetting control signal 539 from the output of the sixth NAND gate 460 is applied to an input of the NAND gate 386 of the clock signal latch 380. When the resetting control signal 539 from the output of the sixth NAND gate 460 is de-asserted and the clock signal 502 is de-asserted to the logical low state after the lagging edge 510, the output 394 of the clock signal latch 380 is de-asserted to the logical low state. In the case of the timing diagram of FIG. 18, because the resetting control signal 539 is de-asserted after the lagging edge 510 of the clock signal cycle, the output 394 of the clock signal latch 380 is de-asserted to the logical low state when the resetting control signal 539 is de-asserted to the logical low state.

As a result, in FIG. 18, the en_write control signal 534, the row_dec_en control signal 512, the col_dec_en control signal 514, and the row_line control signal 518 are also de-asserted to the logical low state, and the Equil control signal 516 is re-asserted to the logical high state, shortly after the resetting control signal 539 is de-asserted to the logical low state (step 632 of FIG. 19). Referring to FIGS. 5, 6, 7, and 18, the Equil control signal 516 that is re-asserted to the logical high state causes the respective set of PMOSFETs 370, 372, and 374 of each of the equilibriating precharge voltage sources 364 and 366 to apply the equilibriating precharge voltage (i.e., $V_{CC}$) to the differential bit lines bit<0> 218, bit<0>* 220, bit<1> 222, and bit<1>* 224. Thus, the bit line signals 520 on the differential bit lines bit<0> 218 and bit<0>* 220 of the selected SRAM cell 208 return to the equilibriating precharge voltage (i.e., $V_{CC}$) shortly after the Equil control signal 516 is re-asserted to the logical high state in FIG. 18 (step 634 of FIG. 19).

Referring to FIGS. 15 and 18, the Equil control signal 516 that is re-asserted to the logical high state causes the en_read control signal 524 to be de-asserted to the logical low state (step 634 of FIG. 19). In addition, the en_read control signal 524 that is applied as an input to the sixth NAND gate 406 of the reset control signal generator 452 and that is de-asserted to the logical low state causes the resetting control signal 539 to be re-asserted to the logical high state in FIG. 18.

In this manner, for the write before read mode with the RBW (read before write) control signal applied on the RBW terminal 440 de-asserted to the logical low state in the alternative memory cell access controller 202A of FIG. 15, the write operation is performed before the lagging edge 510 of the clock signal cycle while the read operation is performed after the lagging edge 510 of the clock signal cycle. In this mode also, the en_read control signal 524 and the en_write control signal 534 are asserted during the one clock signal cycle. Thus, the bandwidth of such operations is doubled from the prior art where each of the read operation and write operation are performed during separate clock signal cycles.

In addition, such a read operation and such a write operation are performed via the same double-ended port comprised of the differential bit lines bit<0> 218 and bit<0>* 220 of the selected SRAM cell 208. Furthermore, such a read operation and such a write operation are synchronized by control signals generated by the alternative memory cell access controller 202A of FIG. 15 as illustrated in the timing diagram of FIG. 18 for controlling operation of the data path 204 of FIG. 5 to prevent contention between such read and write operations during the one clock signal cycle via the same double-ended port of the selected SRAM cell 208.

It will be understood by those of skill in the art that the foregoing description is only exemplary of the invention and is not intended to limit its application to the structure and operation described herein. For example, the present invention may be practiced with more numerous memory cells in an array of memory cells than the two SRAM memory cells 208 and 228 illustrated in FIG. 6. In addition, the present invention may be practiced for accessing other types of memory cells aside from SRAM cells as illustrated and described herein. Furthermore, the present invention may be practiced for performing the read and write operations via a same port of a memory cell with the port being single-ended rather than double-ended as illustrated and described herein. Additionally, the present invention may be practiced for performing the read and write operations via a same one port of a memory cell having multiple ports.

Furthermore, the present invention may be practiced when the leading edge 508 of the clock signal cycle is one of a rising edge or a falling edge with the lagging edge 510 being the other of the rising edge or the falling edge. Also, the present invention may be practiced with reverse logical states than shown in the timing diagrams of FIGS. 11, 13, 16, and 18 with use of inverters. The logical states described and illustrated herein are by way of example only. In addition, many of the components illustrated and described herein for an example embodiment of the present invention may be alternatively implemented in hardware or software and in discrete or integrated circuits.

The term "asserted" associated with a signal herein refers to changing the logical state of a signal from the logical low state to a logical high state, and the term "de-asserted" associated with a signal herein refers to changing the logical state of a signal from the logical high state to a logical low state. However, the term "asserted" and "de-asserted" associated with a signal may be inter-changed herein and in the following claims depending on the direction of change of the signal as such a direction of change of the signals may be reversed with use of inverters. Thus, the terms "asserted" and "de-asserted" associated with a signal herein and in the following claims broadly means having the logical state of the signal changed in either direction.

The present invention is limited only as defined in the following claims and equivalents thereof.

What is claimed is:

1. A method of reading data from and writing data to a memory cell through a single port of the cell, comprising:

providing a memory cell having a port;

providing a same clock signal for reading data from and writing data to the memory cell, the same clock signal having a leading edge and a lagging edge within a clock signal cycle, wherein the same clock signal is a single clock signal for the memory cell;

during a single clock cycle:
asserting an enable read control signal in response to the same clock signal;
asserting an enable write control signal in response to the same clock signal;
in response to the enable read control signal, reading read data stored within the memory cell through a port of the cell; and
in response to the enable write control signal, writing write data to the memory cell through the port.

2. The method of claim 1, including:

detecting an enable signal and a write signal;

during the single clock cycle:
asserting the enable read control signal in response to the same clock signal and enable signal; and
asserting the enable write control signal in response to the same clock signal, enable signal, and write signal.

3. The method of claim 1, wherein the enable write control signal is asserted after the enable read control signal, and the write data is written to the memory cell after the read data is read from the memory cell.

4. The method of claim 3 including detecting a RBW (read before write) signal, wherein the enable write control signal is asserted in response to the same clock signal, enable signal, write signal, and RBW signal.

5. The method of claim 1, wherein the enable read control signal is asserted after the enable write control signal, and the read data is read from the memory cell after the write data is written to the memory cell, the read data thereby being the same as the write data.

6. The method of claim 1, wherein the enable read control signal is asserted in response to the leading edge of the same clock signal.

7. The method of claim 6, wherein the enable write control signal is asserted in response to the leading edge of the same clock signal.

8. The method of claim 1, wherein the enable read control signal and the enable write control signal are asserted in response to the lagging edge of the same clock signal and between the lagging edge of the clock signal and the leading edge of the clock signal in the next cycle.

9. The method of claim 1, wherein the enable write control signal is asserted in response to the leading edge of the same clock signal and the enable read control signal is asserted in response to the lagging edge of the clock signal.

10. The method of claim 1, wherein reading read data stored within the memory cell comprises:

before the enable read control signal is asserted, accessing the memory cell to obtain a pair of differential data bits stored therein; and in response the enable read control signal being asserted, converting the pair of differential data bits to a single-ended read data signal while isolating the single-ended read data signal from the memory cell.

11. The method of claim 1, wherein writing write data into the memory cell comprises:
  in response to a single-ended write data signal, converting the single-ended write data signal to a pair of differential data bits; and
  in response to the write read control signal being asserted, writing the pair of differential data bits to the memory cell.

12. A method of reading data from and writing data to a memory cell through a single port of the cell, comprising:
  providing a clock signal for clocking the memory cell, the clock signal having a leading edge and a lagging edge within a clock signal cycle;
  detecting an enable signal and a write signal;
  during the single clock cycle:
    asserting an enable read control signal in response to the enable signal and clock signal;
    asserting an enable write control signal in response to the enable signal, clock signal, and write signal;
    in response to detecting a RBW (read before write) signal:
      asserting the enable write control signal after the enable read control signal;
      in response to the enable read control signal, reading read data stored within the memory cell through a port of the cell; and
      in response to the enable write control signal, writing write data into the memory cell after the read data is read from the cell through the port;
    in response to not detecting a RBW signal:
      asserting the enable read control signal after the enable write control signal;
      in response to the enable write control signal, writing write data to the memory cell through a port; and
      in response to the enable read control signal, reading the write data from the memory cell through the port.

13. A method of reading data from and writing data to a memory through a single port of the cell, comprising:
  providing a memory cell having a port;
  providing a same clock signal for reading data from and writing data to the memory cell, the same clock signal having a leading edge and a lagging edge within a clock signal cycle, wherein the same clock signal is a single clock signal for the memory cell;
  during a single clock cycle:
    asserting an enable write control signal in response to one of the leading edge and the lagging edge of the same clock signal;
    in response to the enable write control signal, writing write data to the memory cell through a port of the cell;
    asserting an enable read control signal in response to the other of the leading edge and the lagging edge of the same clock signal; and
    in response to the enable read control signal, reading the write data from the memory cell through the port.

14. A system for reading data from and writing data to a memory cell through a single port of the cell in response to a same clock signal, comprising:
  a data path coupled to the memory cell, the data path including a read path operable to couple a port of the memory cell to a read data terminal and a write path operable to couple the port to a write data terminal; and
  a memory cell access controller coupled to the data path, the controller operable in a single cycle of the same clock signal in response to an enable signal, a write signal, and the same clock signal to enable the data path to couple the port of the memory cell via the read path to the read data terminal and to enable the data path to couple the port of the memory cell via the write path to the write data terminal,
  wherein the controller includes:
    an equilibriating precharge control signal generator operable to cause an equilibriating precharge voltage to be applied on said port of said memory cell when data is not being read from or written to said port; and
    a reset control signal generator operable to cause said equilibriating precharge voltage to be re-applied on said port of said memory cell after a cycle of reading data from and writing data to said port of said memory cell.

15. The system of claim 14, wherein the data path includes:
  a write data converter operable to convert single-ended write data provided on the write data input terminal to differential write data for a differential port of the memory cell; and
  a read data converter operable to convert differential read data read from the differential port to single-ended read data for the read data output terminal,
  the data path operable to convert the differential read data to single-ended read data via the read data converter while isolating the single-handed read data from the memory cell.

16. The system of claim 14, wherein the data path includes a precharge voltage generator operable to generate an equilibrating precharge voltage on each bit line of the port of the memory cell.

17. The system of claim 14, wherein the controller includes:
  an address decode enable signal generator operable to generate row and column decode enable signals provided to an address decoder that selects said memory cell for reading data from and writing data to by said system.

18. The system of claim 14, wherein the controller further includes:
  a clock signal latch, coupled to said reset control signal generator, operable to ensure that said equilibrating precharge voltage is not re-applied on said port of said memory cell until after a lagging edge of said cycle of the same clock signal.

19. The system of claim 14, wherein the controller includes:
  an enable read signal generator operable to generate an enable read control signal that is asserted to enable the read path to couple the port of the memory cell to the read data terminal.

20. The system of claim 14, wherein the controller includes:
  an enable write control signal generator operable to generate an enable write control signal that is asserted to enable the write path to couple the port of the memory cell to the write data terminal.

21. The system of claim 14, wherein said memory cell is integrated as part of a FPGA (Field Programmable Gate Array).

22. A system for reading data from and writing data to memory, comprising:
  a memory cell having a single port; and
  a clock signal source operable to provide a same clock signal to read data from and write data to the memory cell port, wherein the same clock signal is a single clock signal for the memory cell, wherein the memory cell port is operable to be read from in response to at least one part of the clock signal and to be written to in response to at least another part of the clock signal.

23. The system of claim 22, wherein the clock signal source and memory cell port are operable to read data from and write data to the memory cell port in a single clock cycle.

* * * * *

UNITED STATES PATENT AND TRADEMARK OFFICE
CERTIFICATE OF CORRECTION

PATENT NO. : 6,917,536 B1
DATED : July 12, 2005
INVENTOR(S) : Loren L. McLaury et al.

It is certified that error appears in the above-identified patent and that said Letters Patent is hereby corrected as shown below:

Column 26,
Line 29, "the single-handed read data" should be -- the single-ended read data --.

Signed and Sealed this

Twenty-seventh Day of September, 2005

JON W. DUDAS
*Director of the United States Patent and Trademark Office*